United States Patent
Kasahara et al.

(10) Patent No.: US 6,548,370 B1
(45) Date of Patent: Apr. 15, 2003

(54) METHOD OF CRYSTALLIZING A SEMICONDUCTOR LAYER BY APPLYING LASER IRRADIATION THAT VARY IN ENERGY TO ITS TOP AND BOTTOM SURFACES

(75) Inventors: Kenji Kasahara, Kanagawa (JP); Ritsuko Kawasaki, Kanagawa (JP); Hisashi Ohtani, Kanagawa (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 20 days.

(21) Appl. No.: 09/640,084

(22) Filed: Aug. 17, 2000

(30) Foreign Application Priority Data

Aug. 18, 1999 (JP) .............................................. 11-231165

(51) Int. Cl.$^7$ ................................................ H01L 29/04
(52) U.S. Cl. ................... 438/FOR 419; 257/50; 257/51; 257/52; 257/347
(58) Field of Search .................. 257/50–52, 347; 438/FOR 150, FOR 244, FOR 419

(56) References Cited

U.S. PATENT DOCUMENTS

| | | |
|---|---|---|
| 4,020,319 A | 4/1977 | Shepard et al. |
| 4,069,080 A | 1/1978 | Osborne |
| 4,234,356 A | 11/1980 | Auston et al. |
| 4,599,133 A | 7/1986 | Miyao et al. |
| 4,609,407 A | 9/1986 | Masao et al. |
| 4,925,273 A | 5/1990 | Maisenbacher et al. |
| 5,219,786 A | 6/1993 | Noguchi |
| 5,432,122 A | 7/1995 | Chae |
| 5,543,352 A | 8/1996 | Ohtani et al. |
| 5,561,081 A | 10/1996 | Takenouchi et al. |
| 5,594,569 A | 1/1997 | Konuma et al. |
| 5,612,250 A | 3/1997 | Ohtani et al. |
| 5,612,251 A | 3/1997 | Lee |
| 5,643,801 A | 7/1997 | Ishihara et al. |
| 5,767,003 A | 6/1998 | Noguchi et al. |
| 5,854,803 A | 12/1998 | Yamazaki et al. |

(List continued on next page.)

FOREIGN PATENT DOCUMENTS

| | | |
|---|---|---|
| JP | 56-064480 | 6/1981 |
| JP | 7-131034 | 5/1995 |
| JP | 7-161634 | 6/1995 |
| JP | 7-321339 | 12/1995 |
| JP | 8-228006 | 9/1996 |
| JP | 09-260676 | 10/1997 |
| JP | 11-219133 | 8/1999 |
| JP | 2000-150412 | 5/2000 |

OTHER PUBLICATIONS

K. Shimizu et al., "High–Mobility Poly–Si Thin–Film Transistors Fabricated by a Novel Excimer Laser Crystallization Method", IEEE Transactions on Electron Devices, vol. 40, No. 1, pp. 112–117, 1993.

Furue et al., "Characteristics and Driving Scheme of Polymer–Stabilized Monostable FLCD Exhibiting Fast Response Time and High Contrast Ratio with Gray–Scale Capability", SID 98 Digest, pp. 782–785.

(List continued on next page.)

Primary Examiner—Fetsum Abraham
(74) Attorney, Agent, or Firm—Eric J. Robinson; Robinson Intellectual Property Law Office, P.C.

(57) ABSTRACT

A laser annealing method for obtaining a crystalline semiconductor film having a large grain size is provided. Laser light is irradiated to the top surface and the bottom surface of an amorphous semiconductor film when crystallizing the amorphous semiconductor film by laser light irradiation. Furthermore, a relationship of $0<(I_0'/I_0)<1$, or $1<(I_0'/I_0)$ is achieved for the ratio $(I_0/I_0')$ between the effective energy strength of the laser light when irradiated to the top surface $(I_0)$ and the effective energy strength of the laser light when irradiated to the bottom surface $(I_0')$

12 Claims, 30 Drawing Sheets

U.S. PATENT DOCUMENTS

| | | | |
|---|---|---|---|
| 5,882,960 | A | 3/1999 | Zhang et al. |
| 5,895,933 | A | 4/1999 | Zhang et al. |
| 5,897,799 | A | 4/1999 | Yamazaki et al. |
| 5,900,980 | A | 5/1999 | Yamazaki et al. |
| 5,910,262 | A | 6/1999 | Baumgart et al. |
| 5,952,058 | A | 9/1999 | Xuan |
| 5,953,597 | A | 9/1999 | Kusumoto et al. |
| 5,959,779 | A | 9/1999 | Yamazaki et al. |
| 5,968,383 | A | 10/1999 | Yamazaki et al. |
| 5,972,742 | A | 10/1999 | Zhang et al. |
| 6,002,101 | A | 12/1999 | Yamazaki et al. |
| 6,002,523 | A | 12/1999 | Tanaka |
| 6,020,045 | A | 2/2000 | Chen et al. |
| 6,038,075 | A | 3/2000 | Yamazaki et al. |
| 6,051,453 | A | 4/2000 | Takemura |
| 6,088,379 | A | 7/2000 | Owa et al. |
| 6,091,047 | A | 7/2000 | Miyakawa et al. |
| 6,171,890 | B1 | 1/2001 | Adachi et al. |
| 6,210,996 | B1 | 4/2001 | Yamazaki et al. |
| 6,266,167 | B1 | 7/2001 | Klug et al. |
| 6,300,176 | B1 | 10/2001 | Zhang et al. |

OTHER PUBLICATIONS

Yoshida et al., "A Full–Color Thresholdless Antiferroelectric LCD Exhibiting Wide Viewing Angle with Fast Response Time", SID 97 Digest, pp. 841–844.

Inui et al., "Thresholdless Antiferroelectricity in liquid crystals and its application to displays", J. Mater. Chem., 1996, 6(4), pp. 671–673.

F. Secco d'Aragona, "Dislocation etch for (100) planes in silicon", J. Electrochem. Soc., vol. 119, No. 7, pp. 948–951, 1972.

U.S. patent application Ser. No. 09/640,521, Kenji Kasahara et al., "Laser Apparatus and Laser Annealing Method", Filed Aug. 17, 2000.

U.S. patent application Ser. No. 09/635,422, Shunpei Yamazaki et al., Laser Apparatus, Laser Annealing Method, and Manufacturing Method of a Semiconductor Device', Aug. 10, 2000.

Y. Helen et al., "Reproducible High Field Effect Mobility Polysilicon Thin Film Transistors Involving Pulsed Nd:YVO$_4$ Laser Crystallization", 1999 IEEE, IEDM 99–297–99–300.

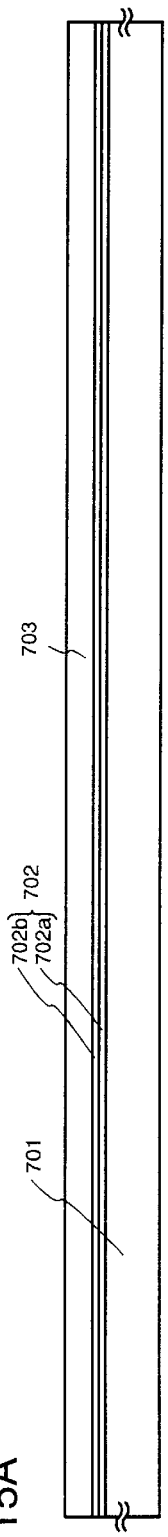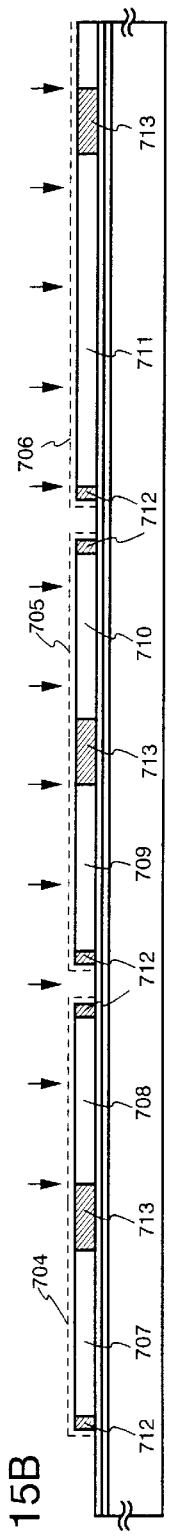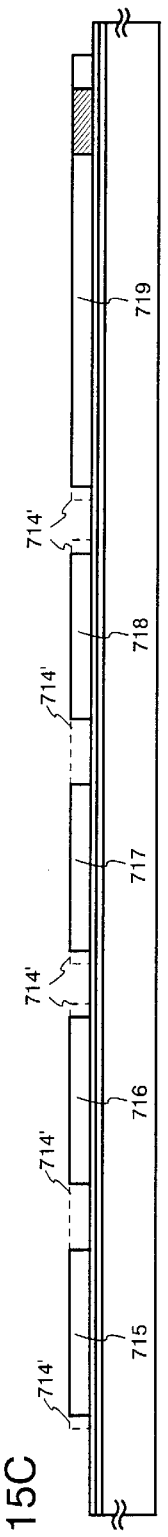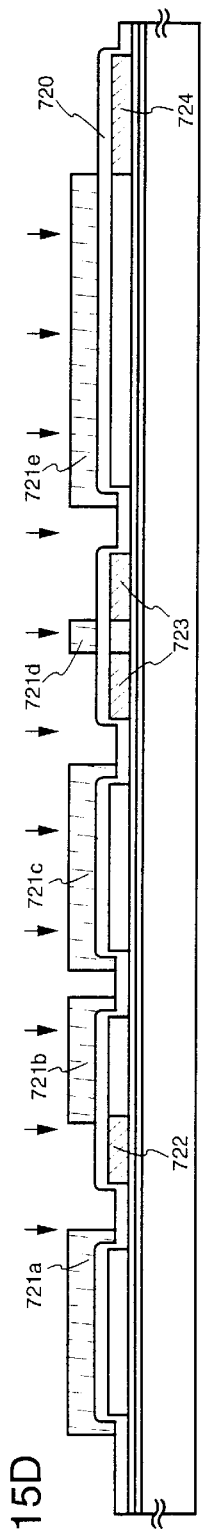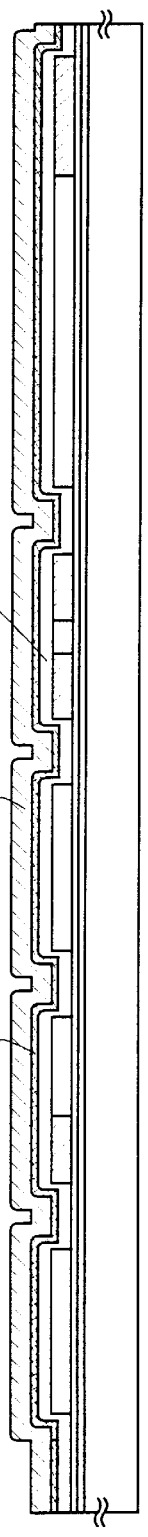

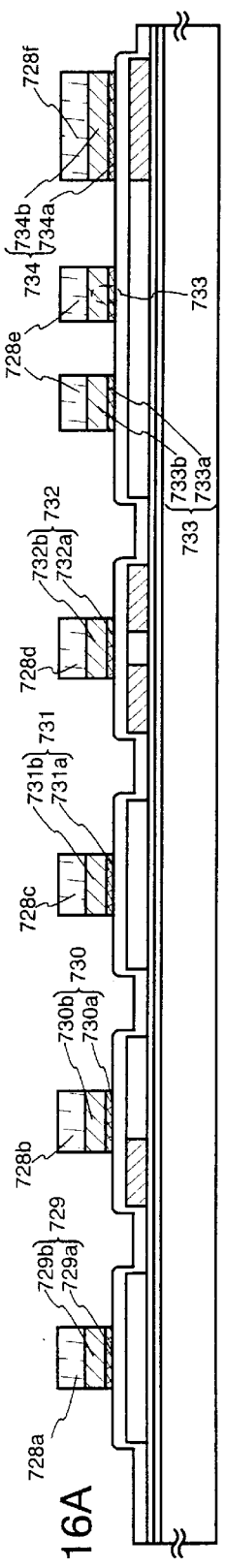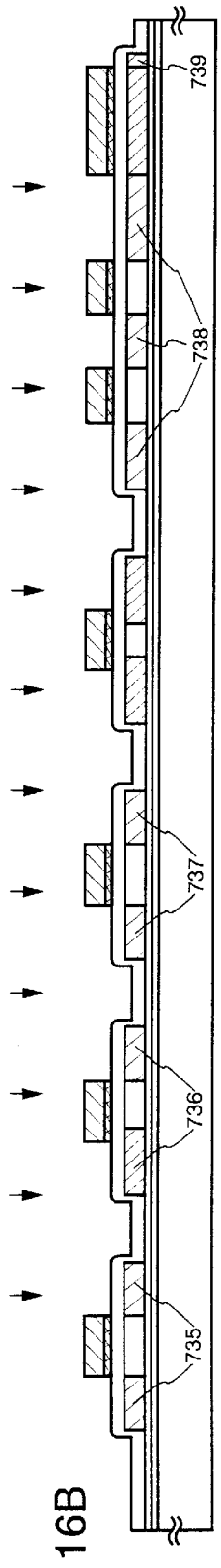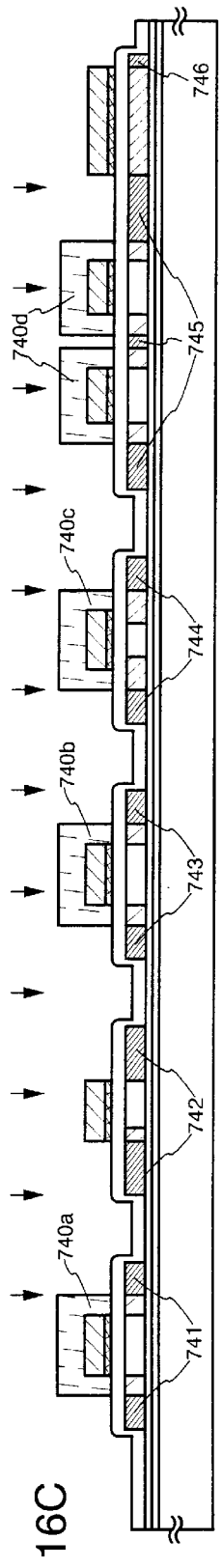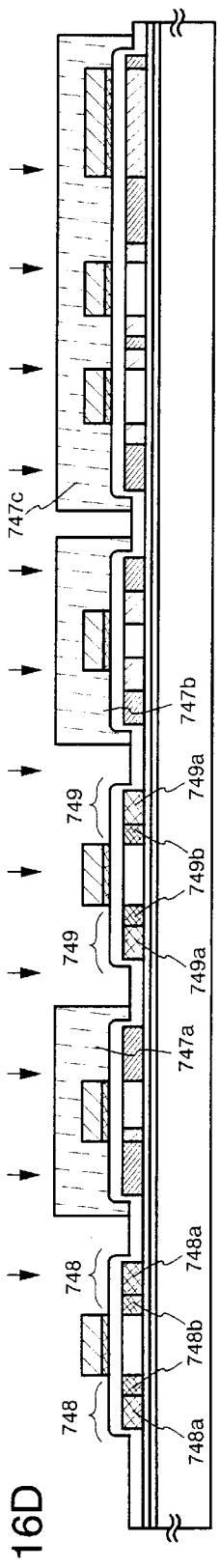

Fig. 17A
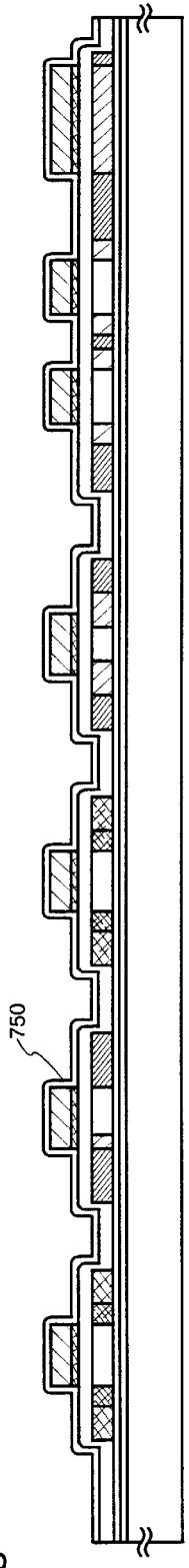
Fig. 17B activating process
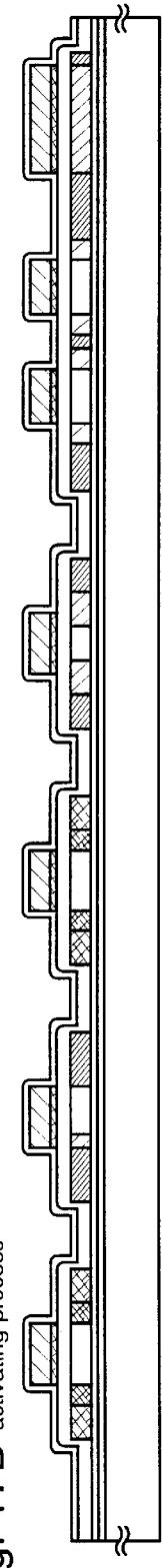
Fig. 17C
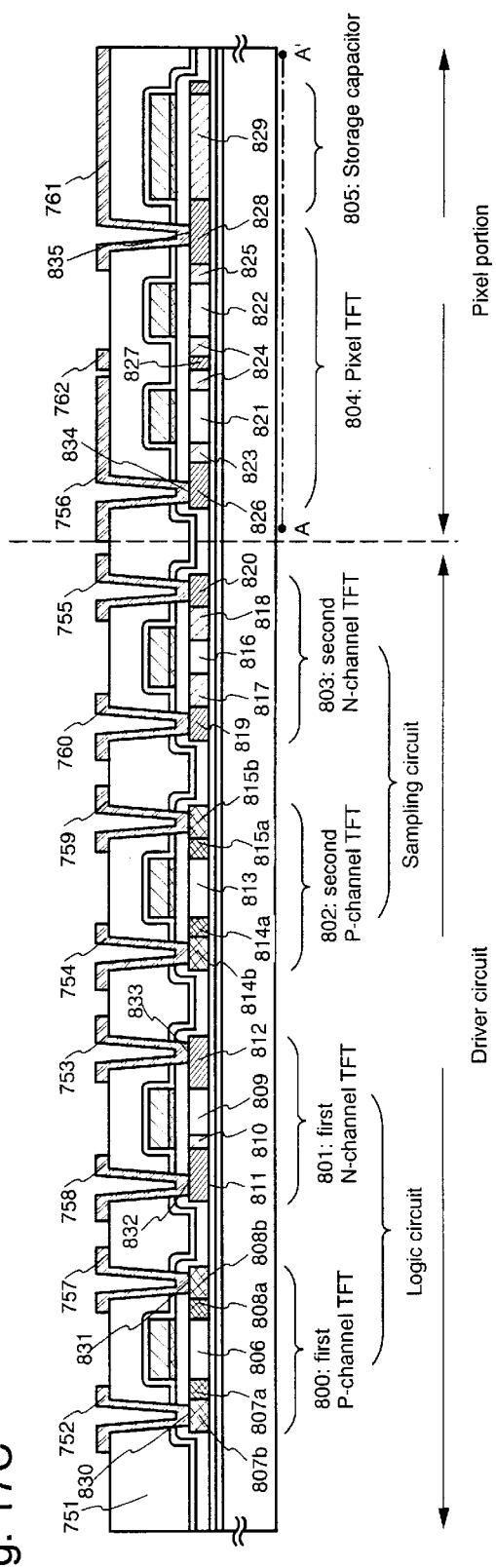

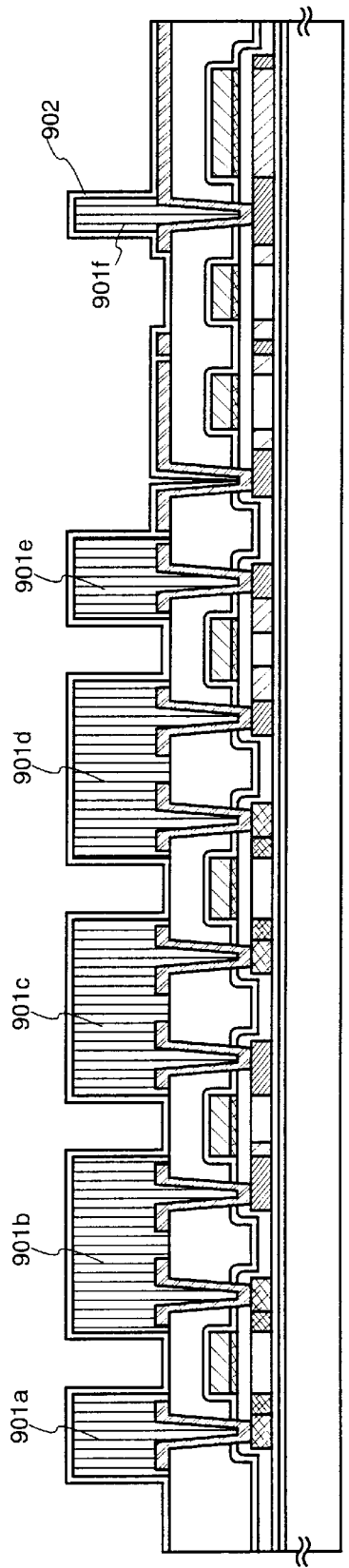
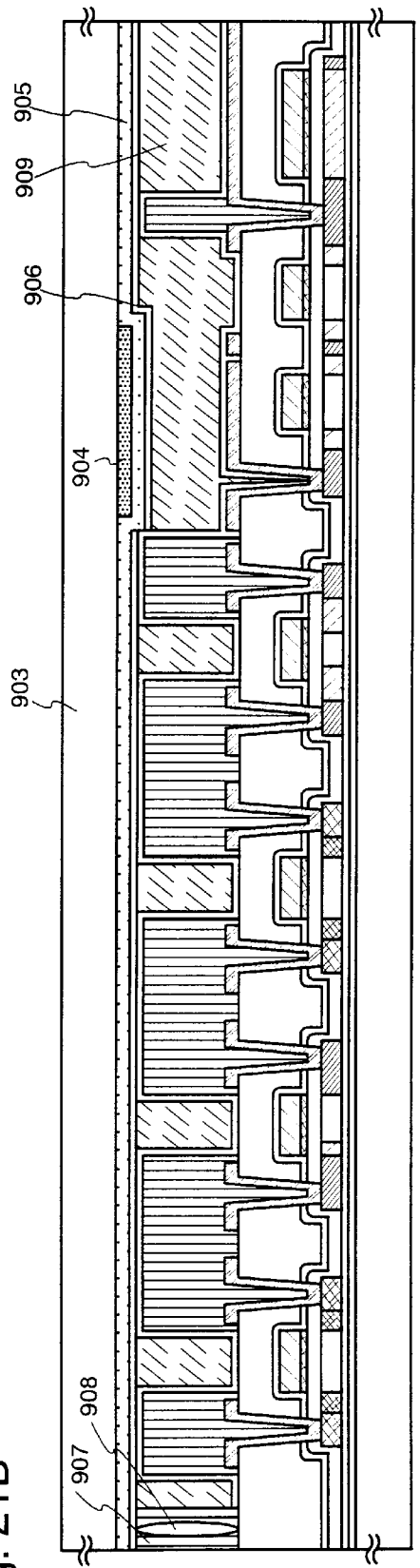
Fig. 21A
Fig. 21B

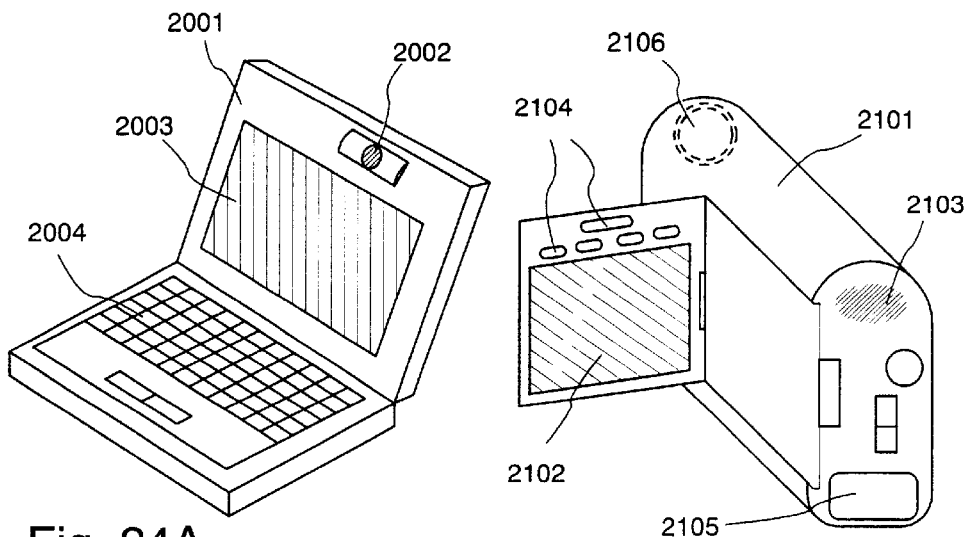
Fig. 24A
Fig. 24B
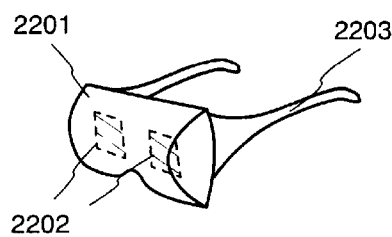
Fig. 24C
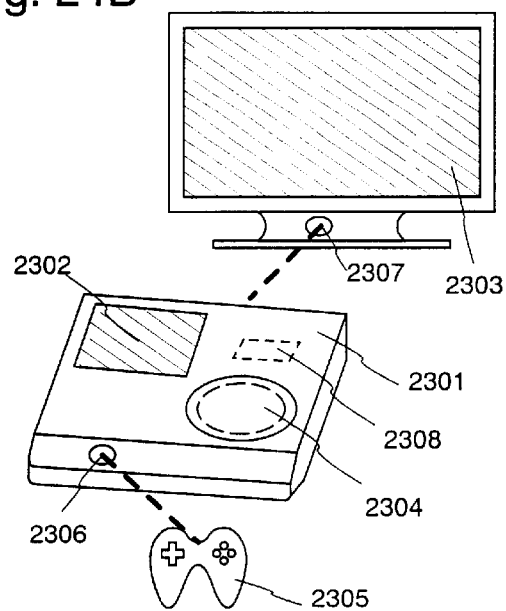
Fig. 24D
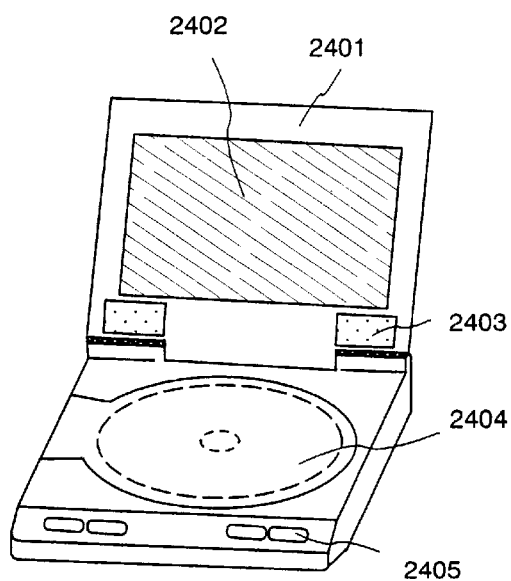
Fig. 24E
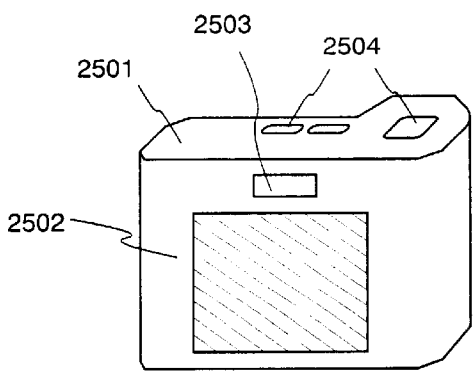
Fig. 24F

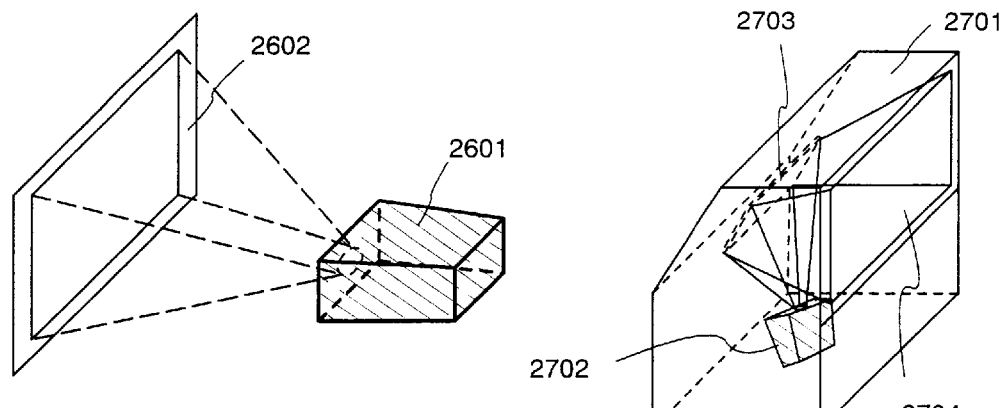
Fig. 25A
Fig. 25B
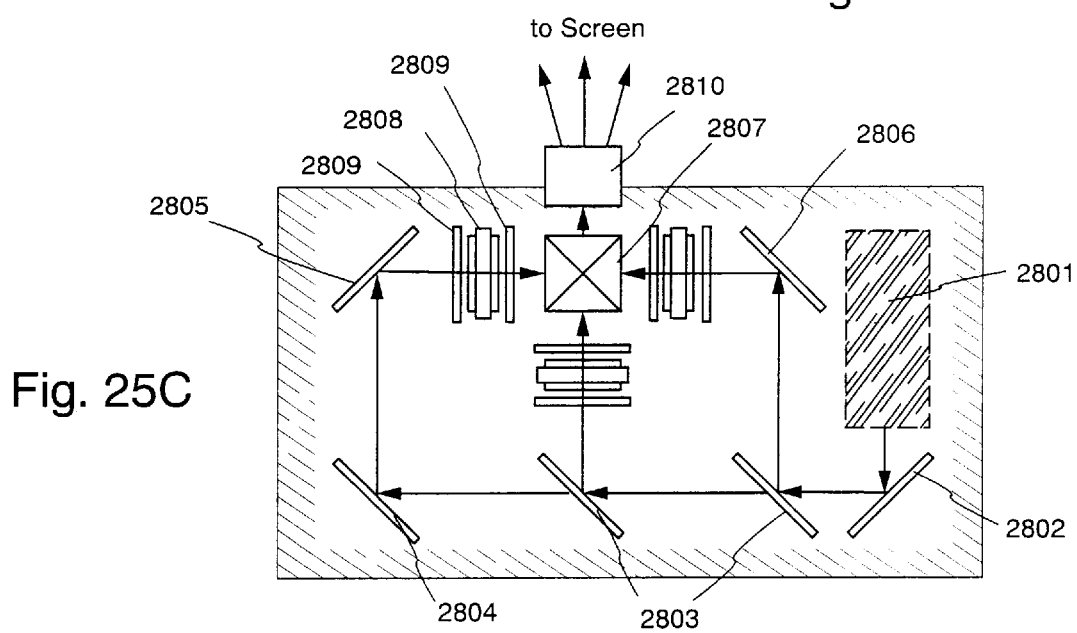
Fig. 25C
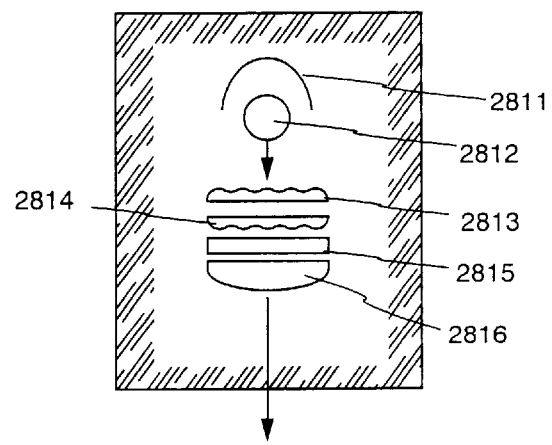
Fig. 25D

METHOD OF CRYSTALLIZING A SEMICONDUCTOR LAYER BY APPLYING LASER IRRADIATION THAT VARY IN ENERGY TO ITS TOP AND BOTTOM SURFACES

BACKGROUND OF THE INVENTION

1. Field of the Invention

The present invention relates to a method of annealing a semiconductor film using laser light (hereafter referred to as laser annealing), and to a laser apparatus for performing laser annealing (an apparatus containing a laser and an optical system for guiding the laser light output from the laser to a processing piece. In addition, the present invention relates to a semiconductor device formed by using that type of laser annealing method, and to a method of manufacturing the semiconductor device.

2. Description of the Related Art

The development of thin film transistors (hereafter referred to as TFTs) has been advancing in recent years, and TFTs using a polycrystalline silicon film (polysilicon film) as a crystalline semiconductor film have been in the spotlight. In particular, the TFTs are used as elements forming a driver circuit for controlling a pixel, or an element which switches the pixel, in a liquid crystal display device (liquid crystal display) or an EL (electroluminescence) display device (EL display).

A technique of crystallizing an amorphous silicon film into a polysilicon film is generally used as a means of obtaining the polysilicon film. In particular, recently a method of crystallizing the amorphous silicon film using laser light has been gathering attention. A means of obtaining a crystalline semiconductor film by crystallizing an amorphous semiconductor film using laser light is referred to as laser crystallization throughout this specification.

Instantaneous heat treatment of the semiconductor film is possible with laser crystallization, and laser crystallization is an effective technique as a means of annealing the semiconductor film formed on a substrate having low heat resistance, such as a glass substrate or a plastic substrate. Furthermore, the throughput is remarkably high compared to a heat treatment means using a conventional electric furnace (hereafter referred to as furnace annealing).

There are many types of laser light, but generally laser crystallization which uses laser light having a pulse emission type excimer laser as an emission source (hereafter referred to as excimer laser light) is employed. The excimer laser has the advantages of high output and being capable of repeated irradiation at a high frequency, and in addition, the excimer laser light has the advantage of having a high absorption coefficient with respect to a silicon film.

The problem drawing the most attention at present is how large can the grain size of a crystalline semiconductor film crystallized by laser light be made. Naturally, if one grain becomes large, then especially the number of grain boundaries crossing a channel forming region of a TFT will be reduced. It therefore becomes possible to improve the electric field effect mobility and the threshold voltage of the TFT, typical electrical characteristics.

Furthermore, relatively clean crystallinity is maintained within each grain, and in order to increase the TFT characteristics as stated above, it is preferable to form the TFT so as to have the channel forming region completely within one grain.

However, it is difficult to obtain a crystalline semiconductor film with a sufficiently large grain size by present techniques, and although there are reports of such films being obtained experimentally, at present this has not reached a level which can be put to practical use.

Experimental results such as those shown in Shimizu, K., Sugiura, O., and Matsumura, M., "High-Mobility Poly-Si Thin-Film Transistors Fabricated by a Novel Excimer Laser Crystallization Method", IEEE Transactions on Electron Devices, Vol. 40, No. 1, pp. 112–7, 1993, have been obtained. A three layer structure of $Si/SiO_2/n^+Si$ is formed on a substrate in the above publication, and is then irradiated by excimer laser light on both the Si layer side and the $n^+Si$ layer side. It is shown that a large grain size can be achieved by this type of structure.

SUMMARY OF THE INVENTION

The present invention has been made to solve the above problems, and an objet of the present invention is to provide a method of laser annealing for obtaining a crystalline semiconductor film having a large grain size, and to provide a laser apparatus which uses the laser annealing method. Further, another object of the present invention is to provide a semiconductor device, and a method of manufacturing the semiconductor device, using the laser annealing method.

The main point of the present invention resides in that laser light is irradiated on both the top surface of an amorphous semiconductor film (the surface on which thin films are formed) and the bottom surface of the amorphous semiconductor film (the surface opposite to the top surface) at the same time when crystallizing the amorphous semiconductor film, and that the effective energy strength of the laser light irradiated on the top surface (hereafter referred to as primary laser light) and the effective energy strength of the laser light irradiated on the bottom surface (hereafter referred to as secondary laser light) differ from each other.

That is to say, when the effective energy strength of the primary laser light is taken as ($I_0$), and the effective energy strength of the secondary laser light is taken as ($I_0'$), the laser light irradiated is characterized in that a relationship of $0<(I_0'/I_0)<1$, or a relationship of $1<(I_0'/I_0)$ is formed for the ratio of effective energy strength($I_0'/I_0$). Of course, $I_0 \cdot I_0' \neq 0$.

Note that, throughout this specification, "effective energy strength" refers to the energy strength of the laser light when it reaches the top surface or the bottom surface of the -amorphous semiconductor film, and is defined as the energy strength after considering energy losses due to things such as reflection (the units are those of density, expressed as $mJ/cm^2$). It is not possible to measure the effective energy strength, but provided that the media which exists along the laser light path is understood, the effective energy strength can be obtained by a calculation of the reflectivity and the transmittivity.

For example, a specific calculation method for effective energy strength is explained for the case of implementing the present invention in the structure shown in FIG. 6. In FIG. 6, reference numeral 601 denotes a aluminum reflecting body, reference numeral 602 denotes a Corning Co. #1737 substrate (thickness 0.7 mm), 603 denotes a 200 nm thick silicon oxynitride film (hereafter referred to as an SiON film), and 604 denotes a 55 nm thick amorphous silicon film. An example of irradiating XeCl excimer laser light with a wavelength of 308 nm on this type of test piece in the air is shown.

The energy strength of the laser light (wavelength 308 nm) just before arriving at the amorphous silicon film 604 is taken to be ($I_a$). At this point, the effective energy strength of the primary laser light ($I_0$) is expressed as $I_o = I_a (1-R_{Si})$ in consideration of the laser light reflected on the surface of the amorphous silicon film. Note that $R_{Si}$ is the reflectivity of laser light. In this case, $I_0 = 0.45 I_a$ in the calculations.

Further, the effective energy strength of the secondary laser light ($I_0'$) is expressed by $I_0' = I_a T_{1737} R_{Al} T_{1737} (1-R_{SiON-Si})$ where $T_{1737}$ is the transmittivity of the #1737 substrate $R_{Al}$ is the reflectivity of the surface of the aluminum, and $R_{SiON-Si}$ is the reflectivity when the laser light is incident on the amorphous silicon film from within the SiON film. Note that the reflectivity of the laser light incident on the SiON film from within the air, the transmittivity within the SiON film, the reflectivity when incident on the #1737 substrate from within the SiON film, and the reflectivity when incident on the SiON film from within the #1737 substrate have been shown experimentally to be ignorable, and therefore they are not included in the calculations. In this case, $I_0' = 0.13 I_a$ in the calculations.

Therefore, for the structure of FIG. 6, the effective energy strength of the primary laser light ($I_0$) is found to be $0.45 I_a$, and the effective energy strength of the secondary laser light ($I_0'$) is found to be $0.13 I_a$. In other words, the effective energy strength ratio ($I_0'/I_0$) is 0.29. One characteristic of the present invention is that the effective energy strength ratio determined as above satisfies the condition $0 < (I_0'/I_0) < 1$.

Further, the present invention is even effective for cases in which the strength of the primary laser light is smaller than the strength of the secondary laser light. Namely, the present invention is also effective for cases in which the effective energy strength ratio satisfies the condition $1 < (I_0'/I_0)$.

The following methods can be given for making the effective energy strengths of the primary laser light and the secondary laser light differ:

1) a method of attenuating the effective energy strength of the secondary laser light by regulating the reflectivity of the reflective body, and making it relatively smaller than the effective energy strength of the primary laser light, when irradiating the laser light on the top surface and the bottom surface of the amorphous semiconductor film by using the reflecting body formed underneath the substrate;

2) a method of forming the secondary laser light by partitioning the primary laser light along its path, effective energy strength of the secondary laser light using a filter (such as a variable attenuater), and making both effective energy strengths differ relatively;

3) a method of attenuating the effective energy strength of the secondary laser light by the substrate material on which the amorphous semiconductor film is formed, and making the effective energy strength of the secondary laser light relatively smaller than the effective energy strength of the primary laser light;

4) a method of sandwiching an insulating film between the substrate and the amorphous semiconductor film, damping the effective energy strength of the secondary laser light by the insulating film, and making it relatively smaller than the effective energy strength of the primary laser light;

5) a method of covering the top surface of the amorphous semiconductor film by an insulating film, making the reflectivity of the primary laser light on the top surface of the amorphous semiconductor film smaller, and making the effective energy strength of the primary laser light relatively larger than the effective energy strength of the secondary laser light;

6) a method of covering the amorphous semiconductor film by an insulating film, attenuating the effective energy strength of the primary laser light, and making it relatively smaller than the effective energy strength of the secondary laser light; and 7) a method of forming the primary laser light and the secondary laser light as separate laser emission sources respectively and differing both the effective energy strengths.

Furthermore, the present invention is not dependent upon the type of laser, and generally known lasers such as an excimer laser (typically a KrF laser or an XeCl laser), a solid state laser (typically an Nd:YAG laser or a ruby laser), a gas laser (typically an argon laser or a helium neon laser), a metal vapor laser (typically a copper vapor laser or a helium cadmium laser), and a semiconductor laser can be used.

Note that when using laser light having a fundamental wavelength which is long, such as the Nd:YAG laser (first harmonic: wavelength 1064 nm), it is preferable to use the second harmonic, the third harmonic, or the fourth harmonic. These harmonics can be obtained using non-linear shape crystals (non-linear shape elements). Further, a known q-switch method may also be used.

How the Present Invention Came About

An explanation is offered, based upon the experimental results, regarding how the applicant of the present invention came up with the concept of the present invention. The SEM (scanning electron microscopy) photographs shown in FIGS. 7A and 7B are photographs of polysilicon films, formed by laser crystallization, on which Secco etching has been performed. Detailed information regarding the Secco etching technique can be found by referring to Secco d'Aragona, F., "Dislocation Etch for (100) Planes in Silicon," J. Electrochem. soc., Vol. 119, No. 7, pp. 948–950 (1972).

Each of the pieces was obtained by irradiating excimer laser light on an amorphous silicon film (film thickness 55 nm) formed on a Corning Co. #1737 substrate (substrate thickness 0.7 mm), through a silicon oxide film (film thickness 200 nm). Note that the excimer laser light used in this experiment was pulse laser light using XeCl gas as an excitation gas, having a wavelength of 308 nm, a pulse width of 30 ns, the number of shots set to 20 shots, and an energy density of 370 mJ/cm$^2$.

FIG. 7A is a polysilicon film (average grain size approximately 0.3 μm) obtained by irradiating the laser light on only the top surface of the amorphous silicon film, and FIG. 7B is a polysilicon film (average grain size approximately 1.5 μm) obtained by irradiating the laser light on both the top surface and the bottom surface of the amorphous silicon film. This shows that the polysilicon film obtained by irradiating the laser light on both the top surface and the bottom surface of the amorphous silicon film has a grain size which is approximately 5 times larger, confirming that irradiation on both surfaces is extremely effective.

Note that the definition of average grain size used throughout this specification is based upon "the definition of grain region average size" used throughout the specification of Japanese Patent Application Laid-open No. Hei 11-219133.

It is thus confirmed that the grain size can be made larger by irradiating laser light on the top surface and the bottom surface of an amorphous semiconductor film. Note that experiments within the literature shown in the conventional examples do not irradiate direct laser light to the bottom surface of the semiconductor film being crystallized, and that an accumulated heat effect is aimed for by utilizing the residual heat of n$_+$Si, a composition of which completely differs from the experiment performed by the applicant of the present invention.

Next, the applicant of the present invention performed a similar experiment using a quartz substrate as a substitute for the glass substrate (note that the laser light energy density was set to 200 mJ/cm$^2$). The results obtained are as shown in FIGS. 8A and 8B (SEM photographs after Secco etching).

FIG. 8A is a polysilicon film obtained by irradiating laser light on only the top surface of an amorphous silicon film, and FIG. 8B is a polysilicon film obtained by irradiating laser light on both the top surface and the bottom surface of an amorphous silicon film. The figures show that, when using a quartz substrate as the substrate, the average grain size is from 0.4 to 0.5 μm at best, and a large grain size such as that shown in FIG. 7B could not be found. Further, no difference was seen in grain size between irradiating from one surface of the substrate and irradiating from both sides of the substrate. In other words, as stated above, in spite of irradiating the laser light to both the top surface and the bottom surface of an amorphous semiconductor film, an effect that an average grain size was increased was not found.

The applicant of the present invention then took the above experimental results into consideration and conjectured that the difference in the experimental results shown in FIGS. 7A and 7B, and FIGS. 8A and 8B, is because of the difference between the transmittivity of the glass substrate (approximately 50%) and the transmittivity of the quartz substrate (approximately 93%), namely the difference between effective energy strengths of the laser light irradiated on the bottom surface of the amorphous semiconductor films. The following experiment was then performed for confirmation.

In this experiment, a test piece having the structure shown in FIG. 6 is first manufactured using a quartz substrate as a substrate 602 and using a tantalum nitride film as a reflecting body 601. XeCl excimer laser light was then irradiated on the test piece using conditions identical to those of the photograph obtained in FIG. 7B. The average grain size of the polysilicon film obtained was confirmed by a SEM photograph after Secco etching. These results are shown in FIG. 9.

As can be understood by looking at FIG. 9, the grain size of the polysilicon film obtained is distributed in a state which is nearly the same as that of the polysilicon film of FIG. 7B. Further, it has already been stated that the effective energy strength ratio between the primary laser light and the secondary laser light for the case of the test piece on which the photograph of FIG. 7B was obtained was 0.29. This is a result in which the secondary laser light is effectively attenuated by the glass substrate. A value of 0.33 was obtained when similarly calculating the effective energy strength ratio for the test piece of the present experiment. This is a result in which the secondary laser light is effectively attenuated by the reflecting body.

Furthermore, the test piece of FIG. 8B (a combination of reflecting bodies made from quartz and aluminum) and the test piece of FIG. 9 (a combination of reflecting bodies made from quartz and tantalum nitride) have the identical structure, except for the difference in the material on the surface of the reflecting body; the point of difference is that the reflectivity on the surface of the reflecting body on the test piece of FIG. 9 is smaller than that of the test piece of FIG. 8B.

Considering the above results, when the effective energy strength of the laser light (secondary laser light) on the bottom surface is smaller than the effective energy strength of the laser light (primary laser light) on the top surface for a case of crystallization by irradiating laser light on the top surface and the bottom surface of an amorphous semiconductor film, it has been confirmed that there is an increase in average grain size.

BRIEF DESCRIPTION OF THE DRAWINGS

In the accompanying drawings:

FIGS. 15A to 15E are diagrams showing a process of manufacturing an active matrix substrate;

FIGS. 16A to 16D are diagrams showing the process of manufacturing the active matrix substrate;

FIGS. 17A to 17C are diagrams showing the process of manufacturing the active matrix substrate;

FIGS. 21A and 21B are diagrams showing the cross sectional structure of an active matrix type liquid crystal display device;

FIGS. 24A to 24F are diagrams showing examples of electronic devices;

FIGS. 25A to 25D are diagrams showing examples of projectors;

DETAILED DESCRIPTION OF THE PREFERRED EMBODIMENTS

Embodiment Mode 1

Figure 1A:
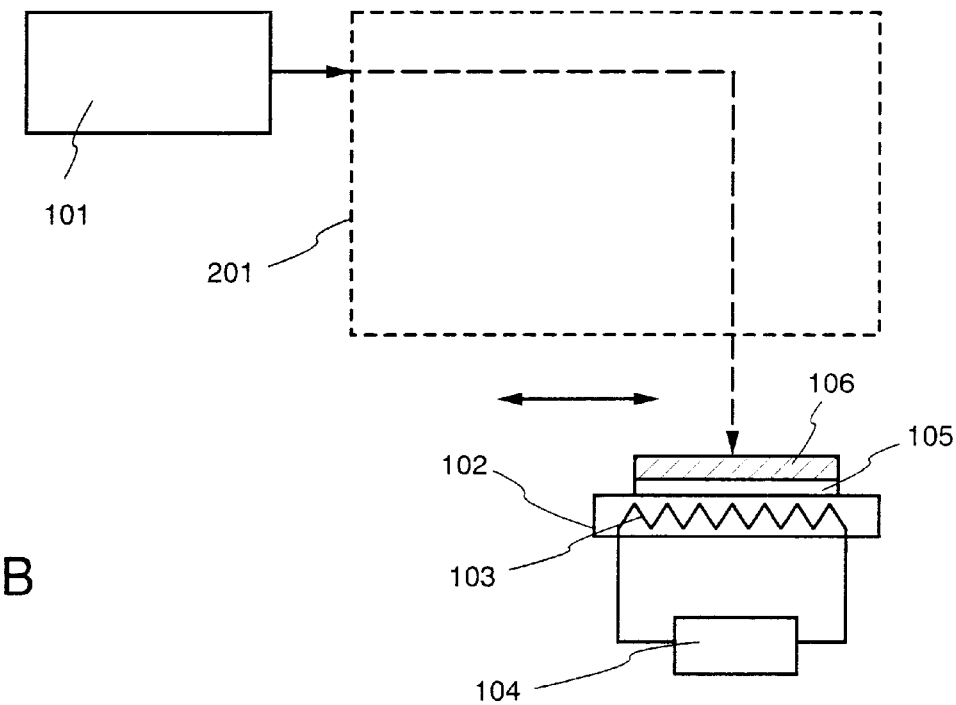
FIGS. 1A and 1B are diagrams showing the composition of a laser apparatus.

An embodiment mode of the present invention is explained. FIG. 1A is a diagram showing the structure of a laser apparatus. The laser apparatus has a laser 101, an optical system 201 for converting laser light from the laser 101 as an emission source into a linear shape, and a stage 102 which is fixed to a transparent substrate. A heater 103 and a heater controller 104 are provided on the stage 102, and the substrate can be maintained at a temperature in a range from room temperature to 550° C. Further, a reflecting body 105 is formed on the stage 102, and a substrate 106 on which an amorphous semiconductor film is formed is arranged on top of the reflecting body 105.

A method of maintaining the substrate 106 in the laser apparatus having the structure of FIG. 1A is explained next using FIG. 1B. The substrate 106 maintained on the stage 102 is placed in a reaction chamber 107, and linear shape laser light from the laser 101 as the emission source is irradiated. The inside of the reaction chamber can be made into a low pressure state or an inert gas atmosphere by an exhaustion system or a gas system not shown in the figures, and heat treatment from 100 to 450° C. can be performed without the semiconductor film becoming contaminated.

Further, the stage 102 can be moved in the reaction chamber along guide rails 108, and the entire surface of the substrate can be irradiated by the linear shape laser light. The laser light is incident from a quartz window, not shown in the figures, formed on the top surface of the substrate 106. Furthermore, in FIG. 1B, a transfer chamber 109, an intermediate chamber 110, and a load-unload chamber 111 are connected to the reaction chamber 107, and the respective chambers are separated by partitioning valves 112 and 113.

A cassette 114 capable of maintaining a plurality of substrates is arranged in the load-unload chamber 111, and the substrates are transported by a conveyor robot 115 provided in the transfer chamber 109. A substrate 106' shows a substrate being conveyed. Laser annealing under low pressure or in an inert gas atmosphere can be preformed successively by using this type of structure.

Figure 2A:
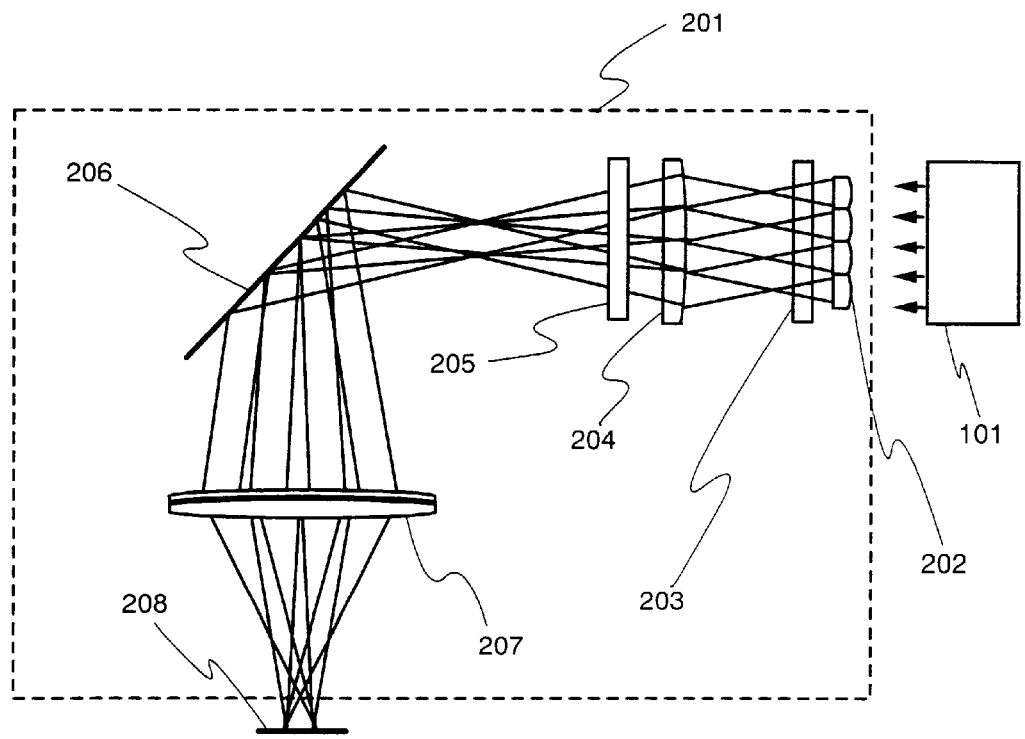
FIGS. 2A and 2B are diagrams showing the composition of an optical system of a laser apparatus.
Figure 2B:
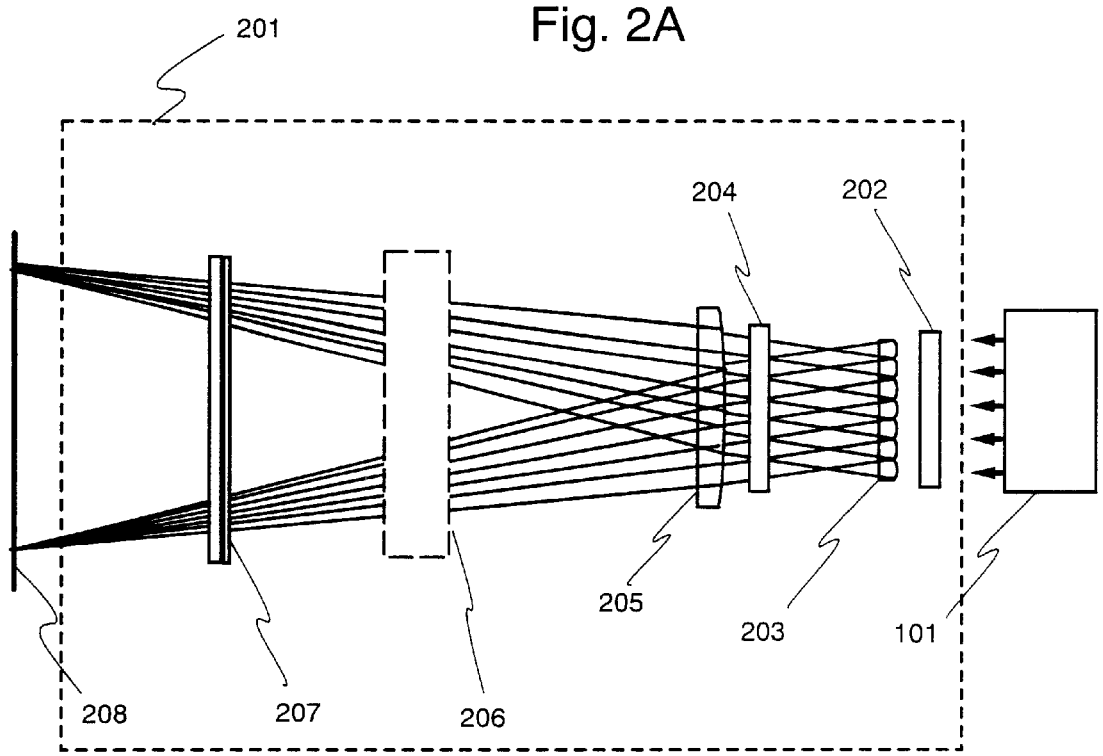

Next, FIGS. 2A and 2B are used to explain the composition of the optical system 201 which forms the laser light into a linear shape. FIG. 2A is a diagram of the optical system 201 seen from the side, and FIG. 2B is a diagram of the optical system 201 seen from above.

The laser light from the laser 101 as the emission source is partitioned in the vertical direction by a cylindrical lens array 202. The partitioned laser light is additionally partitioned in the horizontal direction by a cylindrical lens array 203. In other words, the laser light is ultimately partitioned into a matrix state by the cylindrical lens arrays 202 and 203.

The laser light is then condensed together by a cylindrical lens 204. The laser light passes through a cylindrical lens 205 immediately after the cylindrical lens 204. It is next reflected by a mirror 206, and after passing through a cylindrical lens 207, arrives at an irradiation surface 208.

At this point, the laser light projected on the irradiation surface 208 displays a linear shape on the irradiation surface. This means, in other words, that the cross sectional shape of the laser light which has passed through the cylindrical lens 207 has become linear shaped. The homogenization in the width direction (short direction) of the laser light transformed into a linear shape is performed by the cylindrical lens array 202, the cylindrical lens 204, and the cylindrical lens 207. Further, the homogenization in the length direction (long direction) of the above laser light is performed by the cylindrical lens array 203 and the cylindrical lens 205.

Figure 3:
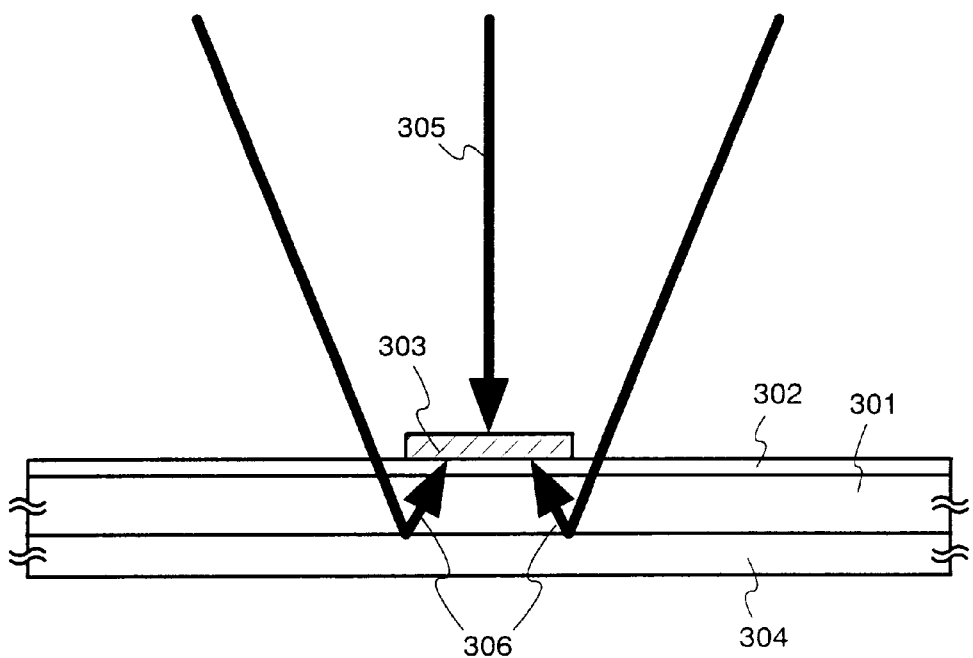
FIG. 3 is a diagram showing a method of laser annealing.

Next, a structure for irradiating laser light to the top surface and the bottom surface of the processing film formed on the substrate is explained using FIG. 3. FIG. 3 is a diagram showing the positional relationship between the substrate 106 and the reflecting body 105 of FIGS. 1A and 1B.

In FIG. 3, reference numeral 301 denotes a transmitting substrate, and on its surface (a surface on which a thin film or elements are formed), an insulating film 302 and an amorphous semiconductor film (or a microcrystalline semiconductor film) 303 are formed. Further, a reflecting body 304 is arranged under the transmitting substrate 301 in order to reflect the laser light.

A glass substrate, a quartz substrate, a crystallized glass substrate, or a plastic substrate can be used as the transmitting substrate 301. It is possible to regulate the effective energy strength of the secondary laser light by the transmitting substrate 301 itself. Further, an insulating film containing silicon, such as a silicon oxide film or a silicon oxynitride film ($SiO_xN_y$) may be used as the insulating film 302, and the effective energy strength of the secondary laser light may also be regulated by the insulating film 302. The amorphous semiconductor film 303 may include, in addition to an amorphous silicon film, a compound semiconductor film such as an amorphous silicon germanium film.

Further, the reflecting body 304 may be a substrate on which a metallic film is formed on the surface (the laser light reflecting surface), or may be a substrate made from a metallic element. In this case, any material may be used as the metallic film. Typically, a metallic film containing an element selected from the group consisting of silicon (Si), aluminum (Al), silver (Ag), tungsten (W), titanium (Ti), and tantalum (Ta) is used. For example, tungsten nitride (WN), titanium nitride (TiN), and tantalum nitride (TaN) may be used.

In addition, the reflecting body 304 may be formed contacting the transmitting substrate 301, or may be formed separated from the transmitting substrate 301. Further, as a substitute for arranging the reflecting body 304, a metallic film such as those stated above may be formed in direct contact with the bottom surface (the surface on the opposite side as the top surface) of the substrate 301 and the laser light can be reflected there. Whichever is used, the effective energy strength of the secondary laser light can be regulated by the reflectivity of the reflecting body 304. Furthermore, when the reflecting body 304 is placed separated from the transmitting substrate 301, it is also possible to control the effective energy strength of the secondary laser light by a gas filling the gap between the two.

The laser light which has been transformed into a linear shape via the optical system 201 explained by FIGS. 2A and 2B is then irradiated on the amorphous semiconductor film 303. The irradiation of the laser light transformed into a linear shape is performed by scanning.

It is important to satisfy a relationship of $0<(I_0'/I_0)<1$, or a relationship of $1<(I_0'/I_0)$, for the effective energy strength ratio $(I_0'/I_0)$ between primary laser light 305 passing through the cylindrical lens 207 and irradiated on the top surface of the amorphous semiconductor film 303, and secondary laser light 306 reflected once by the reflecting body 304 and irradiated on the bottom surface of the amorphous semiconductor film 303. In order to achieve that, it is preferable that the reflectivity of the reflecting body 304 be from 20 to 80% with respect to the laser light. Further, a plurality of the several means of attenuating the effective energy strength of the secondary laser light which are stated by embodiment mode 1 may be used in combination for the desired strength ratio.

The laser light which has passed through the cylindrical lens 207 possesses an angle of incidence of between 45 and 90° C. with respect to the substrate surface by being condensed. Therefore, the secondary laser light 306 also wraps around the bottom surface side of the amorphous semiconductor film 303 and is irradiated. Furthermore, by forming an undulating portion on the reflecting surface of the reflecting body 304 and scattering the laser light, the secondary laser light 306 can be obtained with greater efficiency.

Embodiment Mode 2

An implementation which differs from that of embodiment mode 1 is explained in embodiment mode 2. A reflecting body similar to that of embodiment mode 1 is not used in embodiment mode 2, and an example of irradiating dual stream laser light, separated midstream in an optical system, on the top surface and the bottom surface of an amorphous semiconductor film is shown.

Figure 4A:
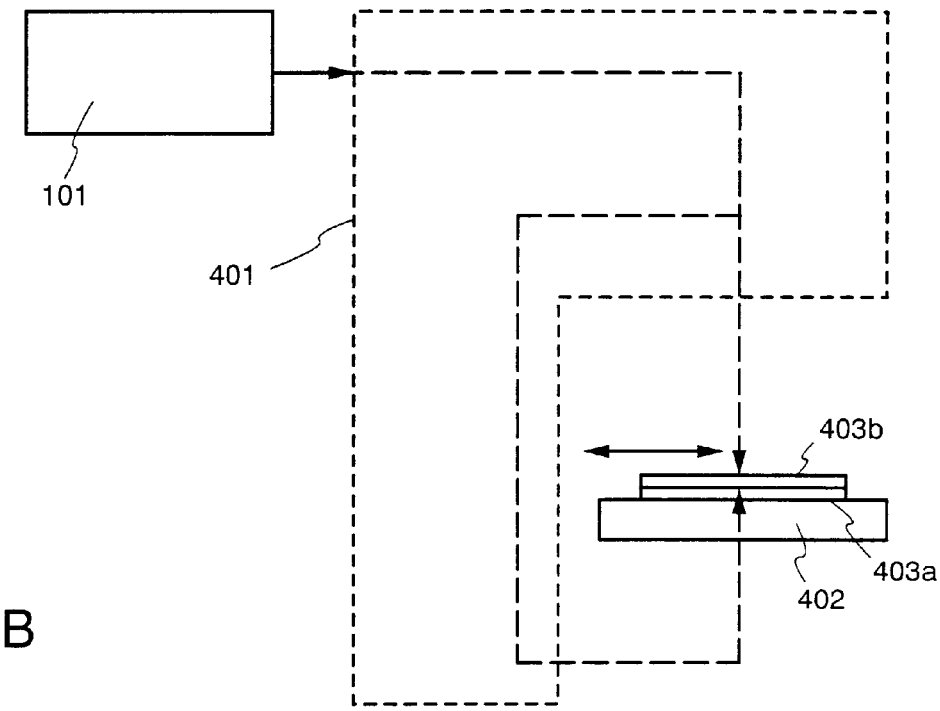
FIGS. 4A and 4B are diagrams showing the composition of a laser apparatus.

FIG. 4A is a diagram showing the structure of the laser apparatus of embodiment mode 2. The basic structure is similar to that of the laser apparatus of FIG. 1 explained by embodiment mode 1, and therefore symbols are changed for differing portions to be explained.

The laser apparatus has the laser 101, an optical system 401 which transforms laser light from the laser 101 as the emission source into a linear shape, and separates the light into dual streams, and a transparent stage 402 for fixing a transparent substrate. Further, a substrate 403a is placed on the stage 402, and an amorphous semiconductor film 403b is formed on the substrate 403a.

In the case of embodiment mode 2, in order to irradiate the laser light which has passed through stage 402 on the amorphous semiconductor film 403b, the stage 402 must have transparency. Further, the laser light irradiated from the stage 402 side (secondary laser light) passes through the stage 402, and therefore it is necessary to consider attenuation of its effective energy strength when passing through the stage 402.

Figure 1B:
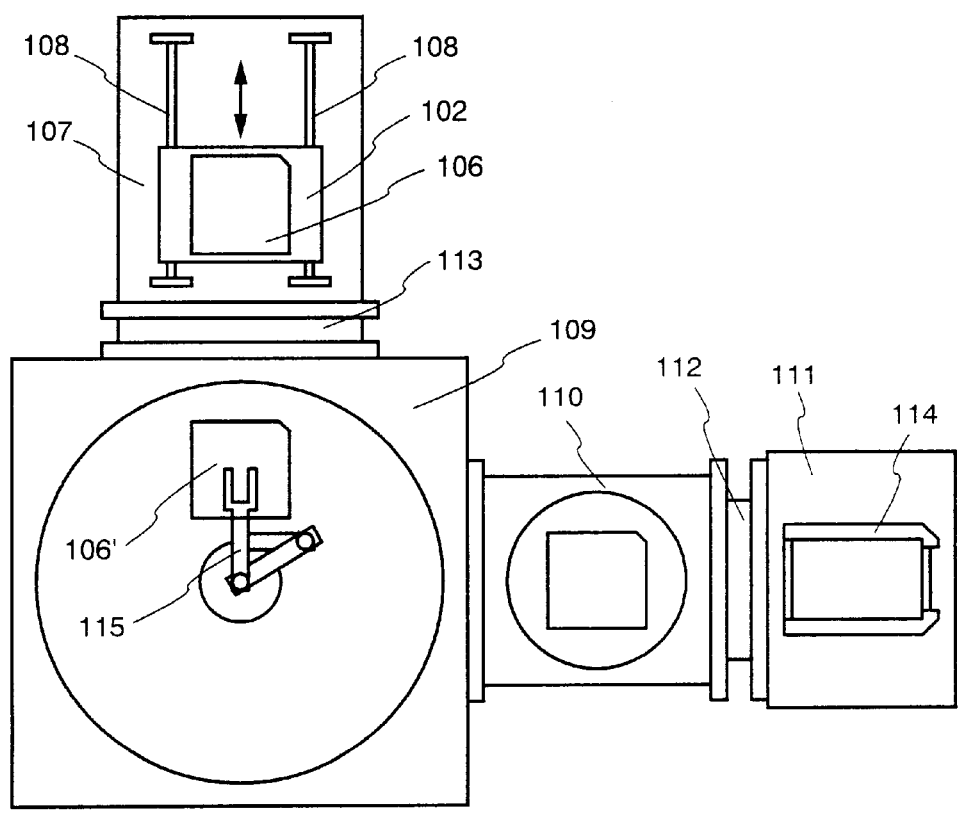
Figure 4B:
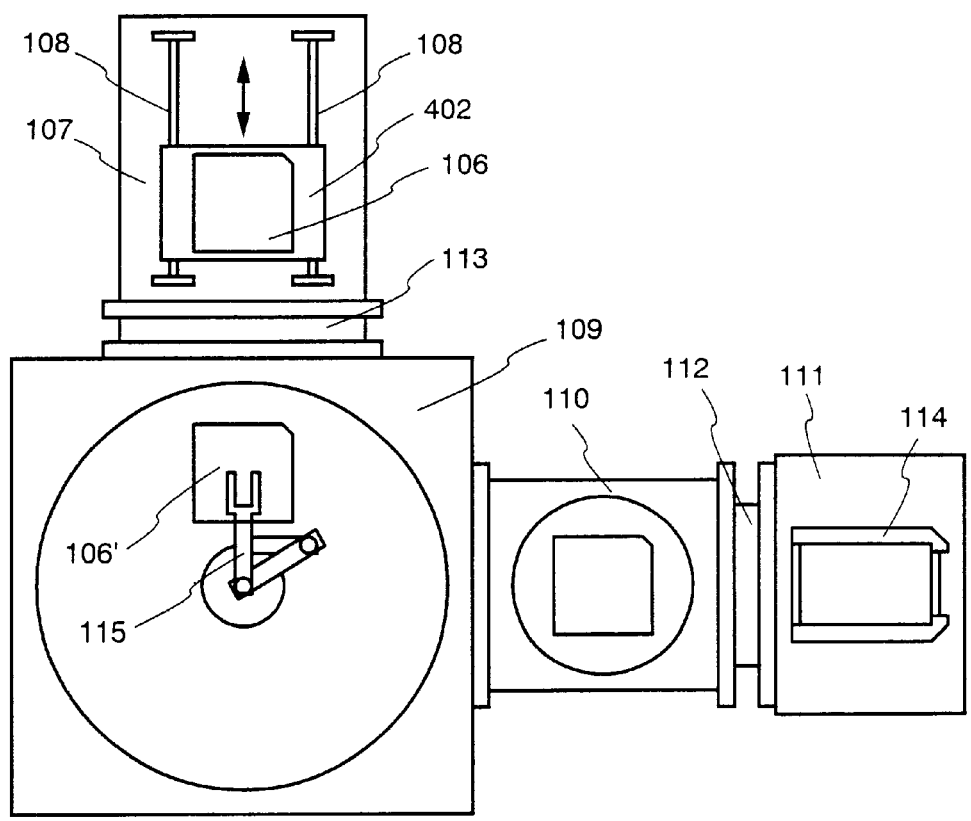

Furthermore, FIG. 4B is a diagram for explaining a method of maintaining the substrate 403a on the laser apparatus shown in FIG. 4A, but except for the use of the transparent stage 402, it is identical to the structure shown in FIG. 1B, and therefore an explanation is omitted.

Figure 5:
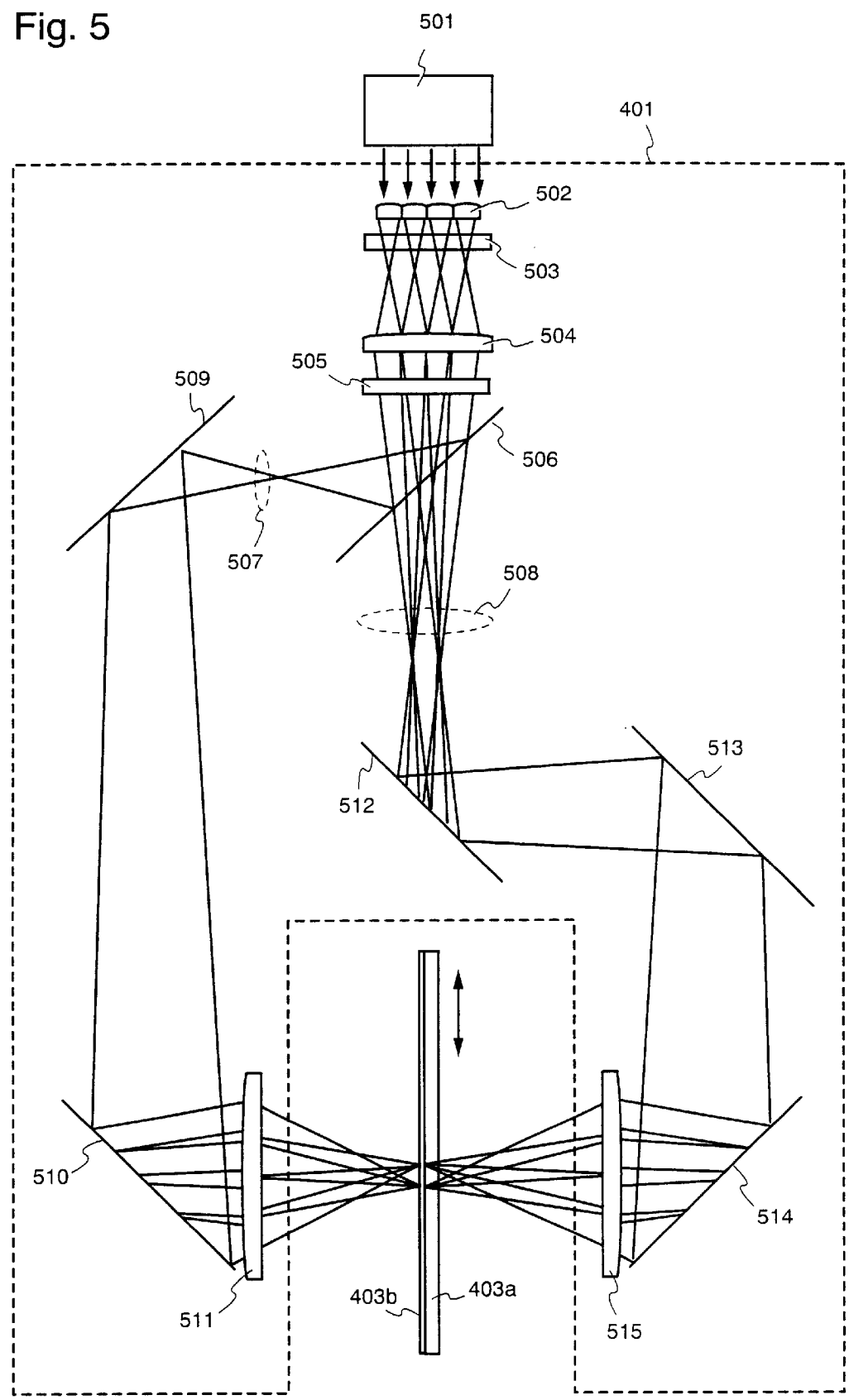
FIG. 5 is a diagram showing the composition of an optical system of a laser apparatus.

The composition of the optical system 401 shown in FIG. 4A is explained next using FIG. 5. FIG. 5 is a diagram of the optical system 401 as seen from the side. Laser light from a laser 501 as an emission source is partitioned in the vertical direction by a cylindrical array lens 502. The partitioned laser light is additionally partitioned in the horizontal direction by a cylindrical array lens 503. The laser light is thus partitioned into a matrix state by the cylindrical lens arrays 502 and 503.

The laser light is then condensed once by a cylindrical lens 504. At this point, a cylindrical lens 505 is passed through directly after the cylindrical lens 504. Up through this point the system is similar to the optical system shown in FIG. 2.

Next, the laser light is made incident to a half mirror 506, and the laser light is separated here into primary laser light 507 and secondary laser light 508. The primary laser light 507 is then reflected by mirrors 509 and 510, and after passing through a cylindrical lens 511 it arrives at the top surface of the amorphous semiconductor film 403b.

Further, the secondary laser light 508 separated by the half mirror 506 is reflected by mirrors 512, 513, and 514, and after passing through a cylindrical lens 515, it is transmitted through the substrate 403a and arrives at the bottom surface of the amorphous semiconductor film 403b.

At this point, the laser light projected on the irradiation surfaces of the substrate shows a linear shape on the irradiation surfaces, similar to embodiment mode 1. Further, the homogenization in the width direction (short direction) of the laser light transformed into a linear shape is performed by the cylindrical lens array 502, the cylindrical lens 504, and the cylindrical lens 515. The homogenization of the above laser light in the length direction (long direction) is performed by the cylindrical lens array 503, the cylindrical lens 505, and the cylindrical lens 509.

It is important to satisfy a relationship of $0<(I_0'/I_0)<1$, or a relationship of $1<(I_0'/I_0)$, for the effective energy strength ratio $(I_0'/I_0)$ between the primary laser light, which passes through the cylindrical lens 511 and is irradiated on the top surface of the amorphous semiconductor film 403b, and the secondary laser light, which passes through the cylindrical lens 515 and is irradiated on the bottom surface of the amorphous semiconductor film 403b.

By using a glass substrate (made of a material having a transmittivity of approximately 50% with respect to the laser light used here) as the substrate 403a in embodiment mode 2, the above relational expressions are satisfied. Of course, in addition to the substrate, the effective energy strength of the secondary laser light may also be attenuated by regulating the transmittivity of an insulating film (not shown in the figures) formed on the substrate 403a, the transmittivity of a stage (not shown in the figures) on which the substrate 403a is placed, and the reflectivity of the interfaces.

Furthermore, it is also possible to attenuate the effective energy strength of the secondary laser light by forming a light attenuater filter in an arbitrary position in the light path of the secondary laser light in the optical system 401. On the other hand, it is also possible to attenuate the effective energy strength of the primary laser light by forming a light attenuater filter in an arbitrary position in the light path of the primary laser light in the optical system 401.

Furthermore, a plurality of the several means of attenuating the effective energy strength of the secondary laser light which are stated in embodiment mode 2 may be used in combination to obtain the desired strength ratio.

Embodiment 1

An example is shown in embodiment 1 of performing crystallization of an amorphous silicon film with the structure shown in embodiment mode 1. FIG. 3 is used for the explanation.

A 1.1 mm thick quartz substrate is used as the substrate 301 in embodiment 1, a 200 nm thick silicon oxynitride film (SiON film) is used as the insulating film 302, and an amorphous silicon film is used as the amorphous semiconductor film 303. The SiON film 302 and the amorphous silicon film 303 are formed by using plasma CVD at this point.

In embodiment 1, at first $SiH_4$ is introduced into the reaction chamber at 4 SCCM, and $N_2O$ is introduced at 400 SCCM. The SiON film 302 is formed with a film deposition temperature of 400° C., a reaction pressure of 30 Pa, a discharge power density of 0.41 W/cm², and a discharge frequency of 60 MHz. Next, $SiH_4$ is introduced into the reaction chamber at 100 SCCM, and the amorphous silicon film 303 is formed with a film deposition temperature of 300° C., a reaction pressure of 45 Pa, a discharge power density of 0.037 W/cm², and a discharge frequency of 13.56 MHz. Note that, in practice, the amorphous silicon film is patterned into an island shape pattern.

Next, an excimer laser apparatus such as that shown in FIG. 1B is used and laser crystallization of the amorphous silicon film 303 is performed. A tungsten nitride film formed on a silicon substrate is used as the reflecting body 304 of FIG. 3 at this time. Further, a 150 μm gap exists between the reflecting body 304 and the quartz substrate 301.

As shown in FIG. 3, excimer laser light (the primary laser light 305 and the secondary laser light 306) is irradiated in this state on the amorphous silicon film 303 at room temperature in an air atmosphere. The excimer laser light is transformed into having a linear shape cross section (0.4 mm×160 mm) by the optical system shown in FIGS. 2A and 2B, and is scanned from one edge of the substrate to the opposite edge. Further, the scanning speed is set to 1 mm/s, the energy density (energy strength corresponding to $I_a$ of FIG. 6) is 336 mJ/cm², the pulse width is 30 ns, and the repetition frequency is set to 30 Hz, with an overlap ratio of 90%. Twenty shots of laser light can thus be irradiated to one location.

Note that when performing laser crystallization with the structure of embodiment 1, the effective energy strength of the primary laser light ($I_0$) is 151.2 mJ/cm², and the effective energy strength of the secondary laser light ($I_0'$) is 77.3 mJ/cm². The effective energy strength ratio ($I_0'/I_0$) is therefore 0.51.

Figure 10:
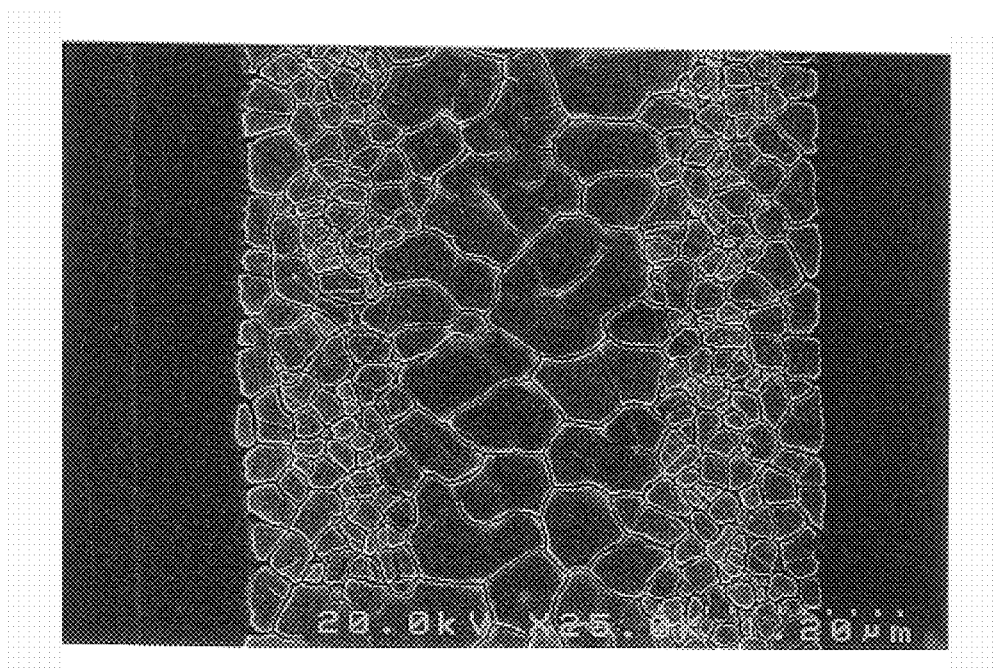
FIG. 10 is an SEM photograph showing a state of polysilicon film grains.

An SEM photograph of a polysilicon film crystallized in accordance with embodiment 1 is shown in FIG. 10. Note that FIG. 10 is a state after Secco etching. A room temperature etchant of 50 cc hydrofluoric acid solution, 25 cc water, with 1.14 g of potassium chromate was used.

As a result, as shown in FIG. 10, relatively large grains having an average grain size of 0.5 to 0.6 μm can be confirmed near the center of the island shape pattern. Grains having a small grain size exist at the edge portion of the island shape pattern, but by changing the laser energy density, the position in which the small grains are formed changes. When actually using a polysilicon film formed by embodiment 1 as an active layer of a TFT, the portion having a small grain size may be designed not to coincide with a channel forming region.

Embodiment 2

An example of performing crystallization of an amorphous silicon film with the structure shown in embodiment mode 1 is shown in embodiment 2. Note that the laser crystallization performed by embodiment 2 is the same as the laser crystallization of embodiment 1 except that the film formed on the top surface of the reflecting body 304 is changed to a tungsten film and the laser energy density is changed to 369 mJ/cm², and therefore embodiment 1 may be referred to for a detailed explanation of other conditions.

Figure 11:
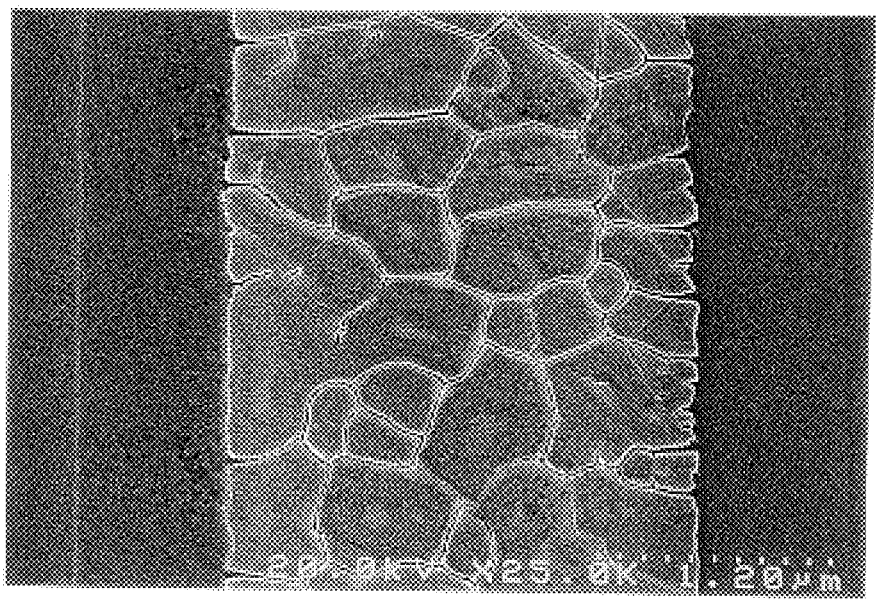
FIG. 11 is an SEM photograph showing a state of polysilicon film grains.

An SEM photograph of a polysilicon film crystallized in accordance with embodiment 2 is shown in FIG. 11. Note that, similar to embodiment 1, FIG. 11 shows a state after Secco etching. Embodiment 1 may be referred to regarding Secco etching conditions.

Note that when performing laser crystallization with the structure of embodiment 2, the effective energy strength of the primary laser light ($I_0$) is 166.1 mJ/cm², and the effective energy strength of the secondary laser light ($I_0'$) is 88.6 mJ/cm². The effective energy strength ratio ($I_0'/I_0$) is therefore 0.53.

As a result, as shown in FIG. 11, relatively large grains having an average grain size of 0.6 to 0.7 μm can be confirmed over the entire island shape pattern. Note that small grains in the edge portion of the island shape pattern, as seen in FIG. 10, were not conspicuous. However, by changing the laser energy density, there are also conditions under which small grains become obvious, and therefore it is necessary to optimize the laser energy density. Furthermore, even if a portion having small grain size exists, it will not become a problem provided that it is designed to be in a location which does not coincide with a channel forming region of a TFT, similar to embodiment 1.

Embodiment 3

An example of performing crystallization of an amorphous silicon film with the structure shown in embodiment mode 1 is shown in embodiment 3. Note that the laser crystallization performed by embodiment 3 is the same as the laser crystallization of embodiment 1 except that the film formed on the top surface of the reflecting body 304 is changed to a titanium nitride film and the laser energy density is changed to 384 mJ/cm², and therefore embodiment 1 may be referred to for a detailed explanation of other conditions.

Figure 12:
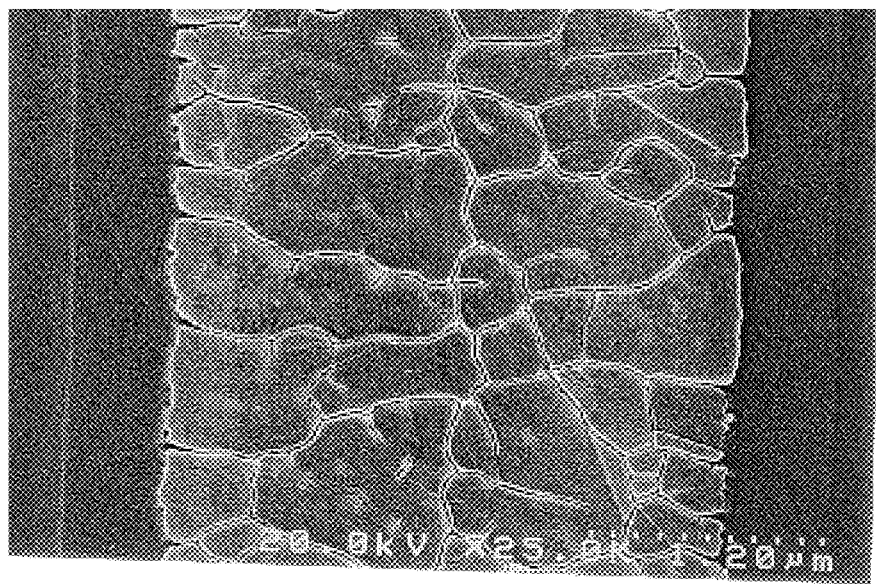
FIG. 12 is an SEM photograph showing a state of polysilicon film grains.

An SEM photograph of a polysilicon film crystallized in accordance with embodiment 3 is shown in FIG. 12. Note that, similar to embodiment 1, FIG. 12 shows a state after Secco etching. Embodiment 1 may be referred to regarding Secco etching conditions.

Note that when performing laser crystallization with the structure of embodiment 3, the effective energy strength of the primary laser light ($I_0$) is 172.8 mJ/cm², and the effective energy strength of the secondary laser light ($I_0'$) is 57.6 mJ/cm². The effective energy strength ratio ($I_0'/I_0$) is therefore 0.33.

As a result, as shown in FIG. 12, relatively large grains having an average grain size of 0.8 to 1.0 μm can be confirmed over the entire island shape pattern. The grains have a shape which is long in the horizontal direction when facing the page, and this may suggest the possibility of crystallization proceeding from the edge portion of the island shape pattern in the horizontal direction. This tendency can also be seen somewhat in FIG. 11.

Further, by changing the laser energy density, there are also conditions under which small grains become obvious, and therefore it is necessary to optimize the laser energy density. In addition, even if a portion having small grain size exists, it will not become a problem provided that it is designed to be in a location which does not coincide with a channel forming region of a TFT, similar to embodiment 1.

Embodiment 4

An example of forming a polysilicon film, which becomes an active layer of a TFT, by the method of embodiment mode 1 or embodiment mode 2 is explained in embodiment 4. FIGS. 13A to 13E are used for the explanation.

First, a 200 nm thick silicon oxynitride film (not shown in the figures) is formed on a glass substrate, and a 50 nm thick amorphous silicon film (not shown in the figures) is formed on the silicon oxynitride film. The amorphous silicon film is patterned next, forming island shape patterns 1301a and 1301b made from the amorphous silicon film. (See FIG. 13A.)

Next, the island shape patterns 1301a and 1301b are laser crystallized in accordance with the method of embodiment mode 1 or embodiment mode 2. Island shape patterns 1302a and 1302b made from polysilicon films obtained by laser crystallization may have regions of small grain 1303a and 1303b in an edge portion. Further, the edge portions of the island shape patterns 1302a and 1302b are regions containing many crystal defects and lattice distortions. (See FIG. 13B.)

Note that dotted lines denoted by reference numerals 1304a and 1304b are traces of the island shape patterns 1301a and 1301b made from the amorphous silicon film, and this means that the island shape patterns shrink by between 1 and 15% due to laser crystallization. It is thought that this shrinkage is caused by the densification and gasification of the silicon film, but it is not particularly clear.

Further, the traces 1304a and 1304b of the island shape patterns 1301a and 1301b become a step of the silicon oxynitride film (not shown in the figures) formed below and remain.

Next, the island shape patterns 1302a and 1302b from the polysilicon film are again patterned, forming active layers 1305a and 1305b. Note that dotted lines denoted by reference numerals 1306a and 1306b are traces of the small grain regions 1303a and 1303b. Further, an additional step in the silicon oxynitride film (not shown in the figures) formed underneath is formed by the formation of the active layers 1305a and 1305b. (See FIG. 13C.)

In other words, a first step formed along the shape of the island shape patterns 1301a and 1301b, formed in the above step, and a second step formed along the shape of the active layers 1305a and 1305b are formed in the silicon oxynitride film on the glass substrate. A technique of forming a first shape semiconductor pattern, performing laser crystallization, and then additionally patterning the first shape semiconductor pattern, forming a second shape semiconductor pattern, is disclosed in Japanese Patent Application Laid-open No. Hei 8-228006. The above stated two steps remain if this technique is used.

A gate insulating film is formed next from an 80 nm thick silicon oxynitride film, covering the active layers 1305a and 1305b, and a gate electrode 1307 is formed on the gate insulating film. The gate electrode 1307 is formed by a lamination structure of a tungsten nitride film and a tungsten film, and has a film thickness of 300 nm. (See FIG. 13D.)

A process of adding an impurity element which imparts n-type conductivity is performed after forming the gate electrode 1307, forming a source region 1308a, a drain region 1309a, and an LDD region 1310. In addition, a process of adding an impurity element which selectively imparts p-type conductivity is performed, forming a source region 1308b and a drain region 1309b. Further, channel forming regions 1311a and 1311b (regions of the active layers in which impurity elements are not added) are formed at the same time.

After next forming a 1 μm thick interlayer insulating film (not shown in the figures) from a silicon oxide film, contact holes are opened, and source wirings 1312a and 1312b, and a drain wiring 1313 are formed. The wirings may be formed by a low resistance conductive film having aluminum film as its main constituent. (See FIG. 13E.)

Figure 13A:
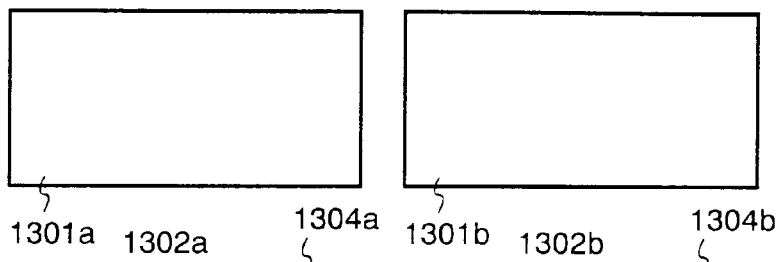
FIGS. 13A to 13E are diagrams showing a process of manufacturing a CMOS circuit using TFTs.
Figure 13B:
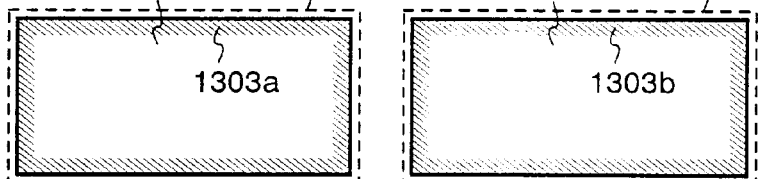
Figure 13C:
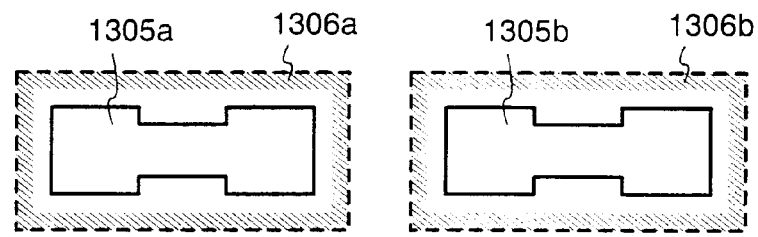
Figure 13D:
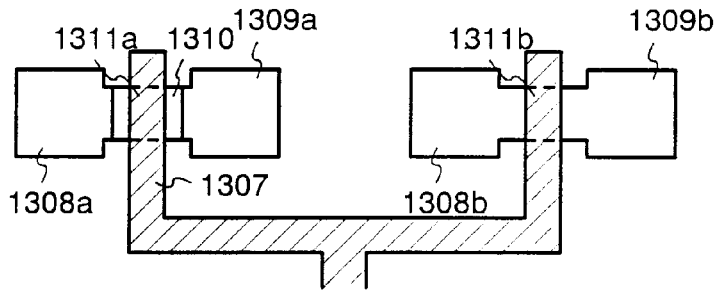
Figure 13E:
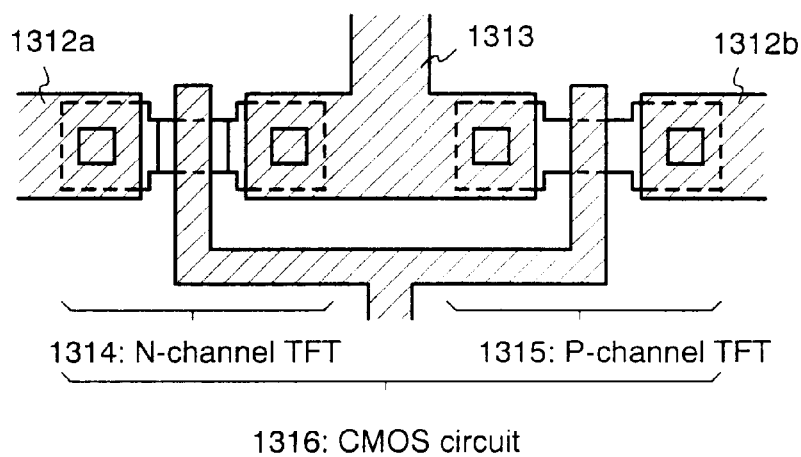

Thus, a CMOS circuit 1316, in which an n-channel TFT 1314 and a p-channel TFT 1315 are combined in complementarity, is formed as shown in FIG. 13E.

Note that embodiment 4 is one example of implementing the present invention when forming an active layer of a TFT, and it is not necessary to limit the implementation to this manufacturing process. The present invention can be used in all known TFT manufacturing processes. However, cases of forming a light shielding film etc. under the active layer, namely cases in which it is impossible to perform laser annealing at the same time on the top surface and the bottom surface of the amorphous semiconductor film, are excluded.

Furthermore, an example is shown in embodiment 4 of forming a CMOS circuit, but it is also possible to easily manufacture a pixel TFT formed in a pixel portion of an active matrix type image display device by using known techniques.

Embodiment 5

The arrangement for a case of using a crystalline semiconductor film formed by embodiment mode 1 or embodiment mode 2 as an active layer of a TFT is explained in embodiment 5.

Figure 26:
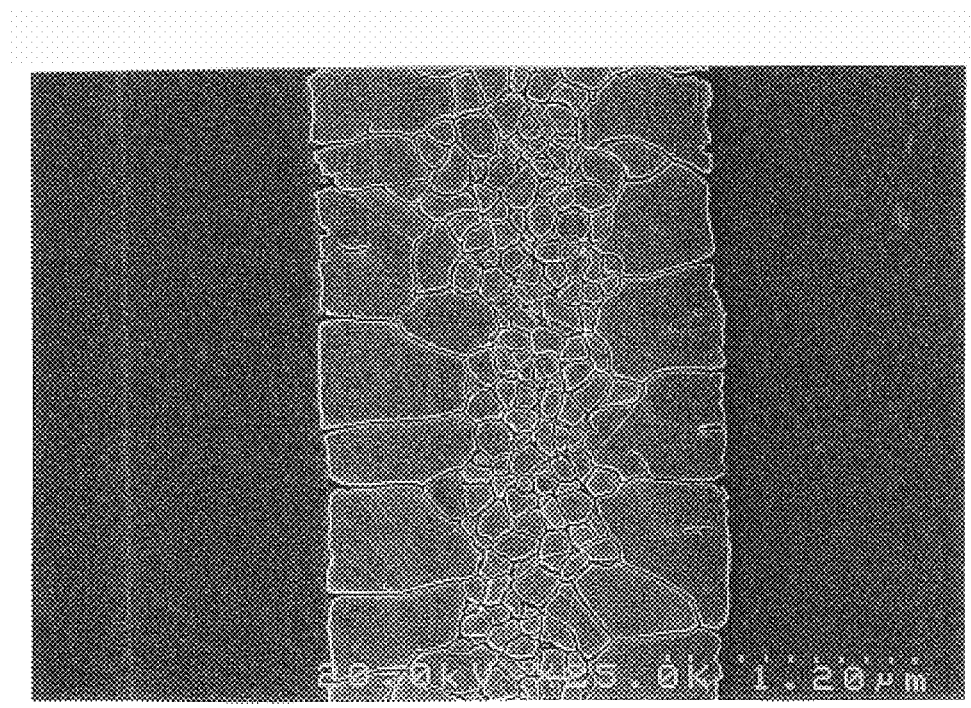
FIG. 26 is a diagram showing a test piece structure.

By changing the laser energy density to 384 mJ/cm$^2$ in the conditions of embodiment 2 and performing laser annealing, it can be confirmed that grains are distributed in a state such as that shown in FIG. 26 for the polysilicon film obtained. Namely, a large average grain size first region is formed in the edge portion of an island shape pattern, and a second region having a smaller average grain size than that of the first region is formed in the center portion. Note that the average grain size of the second region is equal to or less than $\frac{1}{3}$ of the average grain size of the first region. In this case, it is necessary to design the arrangement of the active layer so as not to use the second region of the center portion, as shown in FIG. 14A.

Figure 14A:
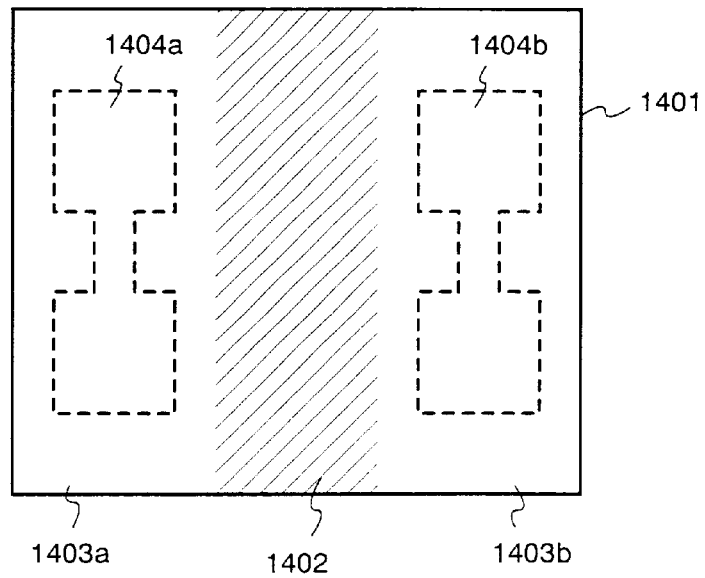
FIGS. 14A and 14B are diagrams showing examples of active layer arrangement.

In FIG. 14A, reference numeral 1401 denotes a schematic diagram of an island shape pattern formed under the conditions of embodiment 5, and reference numeral 1402 denotes a second region. Further, reference numerals 1403a and 1403b denote first regions (regions used as active layers), and dotted lines denoted by reference numerals 1404a and 1404b correspond to portions forming the active layers.

Figure 14B:
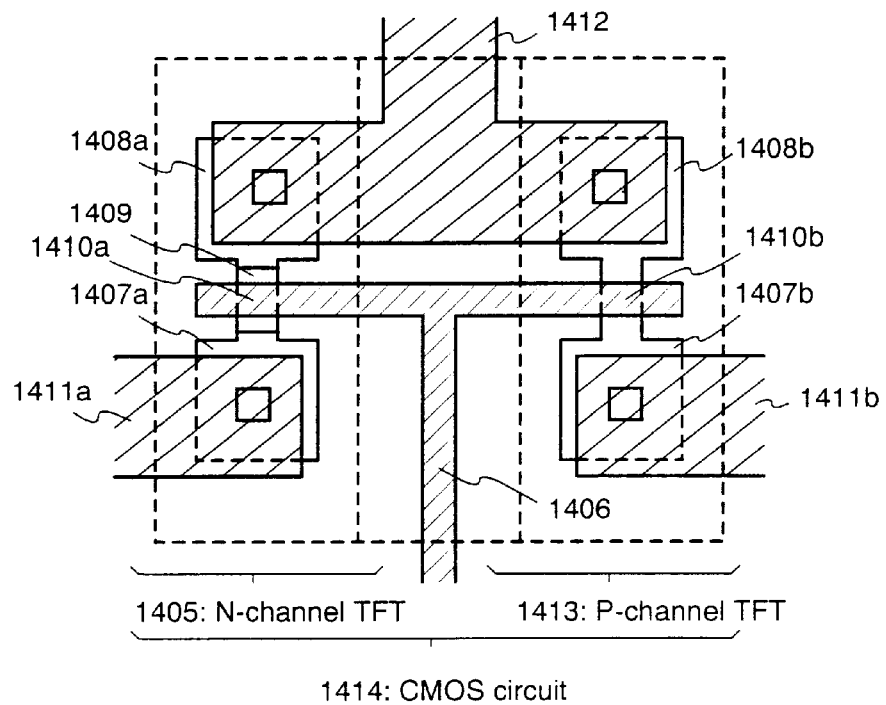

Further, as shown in FIG. 14B, it is also possible to form a CMOS circuit combining two types of TFTs (an n-channel TFT and a p-channel TFT) having active layers arranged as in FIG. 14A.

In FIG. 14B, an n-channel TFT 1405 is composed of a gate electrode 1406, a source region 1407a, a drain region 1408a, an LDD region 1409, a channel forming region 1410a, a source wiring 1411a, and a drain wiring 1412. Further, a p-channel TFT 1413 is composed of the gate electrode 1406, a source region 1407b, a drain region 1408b, a channel forming region 1410b, a source wiring 1411b, and the drain wiring 1412.

The gate electrode 1406 and the drain wiring 1412 are shared by the n-channel TFT 1405 and the p-channel TFT 1413, and the CMOS circuit can be formed. Of course, it is also possible to form other electrical circuits or electric elements.

Note that, as also stated in embodiment 4, if embodiment 5 is implemented, then a step corresponding to the island shape pattern 1401 and a step corresponding to the active layers 1404a and 1404b are formed in an insulating film (or a substrate) as a base of the polysilicon film. This can be regarded as a characteristic in implementing embodiment 5.

The common idea of FIG. 14A and FIG. 14B is that the active layers are arranged so that at least the channel forming regions are formed in the large grain size first regions. It is most preferable to arrange the channel forming regions so as to have one grain boundary, ideally zero grain boundary, contained within the channel forming regions. By doing so, it is possible to improve the typical electrical characteristics of, the electric field mobility and the threshold voltage of the TFTs.

Embodiment 6

In embodiment 6, a case of manufacturing TFTs by cutting out active layers from an island shape pattern having a crystal state as explained by FIG. 26 of embodiment 5 is explained. Specifically, a method of manufacturing a pixel TFT and a storage capacitor of a pixel portion, and an n-channel TFT and a p-channel TFT of a driver circuit formed in the periphery of the pixel portion at the same time is explained. FIGS. 15A to 17C are used for the explanation.

In FIG. 15A, in addition to a glass substrate such as barium borosilicate glass or aluminum borosilicate glass, typified by Corning Co. #7059 or #1737 etc., a plastic substrate not having optical anisotropy, such as polyethylene terephthalate (PET), polyethylene naphthalate (PEN) or polyether sulfone (PES) can be used as a substrate 701. Further, a quartz substrate and a crystallized glass substrate may also be used.

A base film 702 for preventing diffusion of impurities from the substrate 701 and made from a silicon oxide film, a silicon nitride film, or a silicon oxynitride film is formed on the surface of the substrate 701 on which the TFTs are formed. A lamination of a 10 to 200 nm (preferably between 50 and 100 nm) thick silicon oxynitride film 702a manufactured from $SiH_4$, $NH_3$, and $N_2O$ by plasma CVD, and a 50 to 200 nm (preferably between 100 and 150 nm) thick hydrogenated silicon oxynitride film similarly manufactured from $SiH_4$ and $N_2O$ is formed in embodiment 6.

The silicon oxynitride film is formed using a conventional parallel substrate type plasma CVD method. The silicon oxynitride film 702a is made by introducing $SiH_4$ at 10 SCCM, $NH_3$ at 100 SCCM, and $N_2O$ at 20 SCCM into the reaction chamber, with a substrate temperature of 325° C., a reaction pressure of 40 Pa, a discharge power density of 0.41 W/cm$^2$, and a discharge frequency set to 60 MHz. On the other hand, the hydrogenated silicon oxynitride film 702b is made by introducing $SiH_4$ at 5 SCCM, $N_2O$ at 120 SCCM, and $H_2$ at 125 SCCM into the reaction chamber, with a substrate temperature of 400° C., a reaction pressure of 20 Pa, a discharge power density of 0.41 W/cm$^2$, and a discharge frequency set to 60 MHz. These films can be formed in succession by only changing the substrate temperature and changing the reaction gasses.

Further, when considering mainly the substrate, the silicon oxynitride film 702a is formed so as to have an internal stress which becomes a tensile stress. The hydrogenated silicon oxynitride film 702b is also given an internal stress in the same direction, but so that the absolute value of its internal stress is relatively smaller than that of the silicon oxynitride film 702a.

Next, an amorphous semiconductor film 703 is formed with a thickness of 25 to 80 nm (preferably between 30 and 60 nm) by a known method, such as plasma CVD or sputtering. For example, an amorphous silicon film is formed with a thickness of 55 nm by plasma CVD. It is possible to form both the base film 702 and the amorphous semiconductor film 703 in succession at this point. For example, after depositing the silicon oxynitride film 702a and the hydrogenated silicon oxynitride film 702b in succession by plasma CVD, as stated above, the amorphous semiconductor film 703 can also be formed in succession without exposure to the atmosphere by only changing the reaction bas from $SiH_4$, $N_2O$, and $H_2$ to $SiH_4$ and $H_2$, or to only $SiH_4$. As a result, it becomes possible to prevent contamination of the surface of the hydrogenated silicon oxynitride film 702b, and dispersion in the characteristics of the manufactured TFTs and changes in the threshold voltage can be reduced.

Figure 18A:
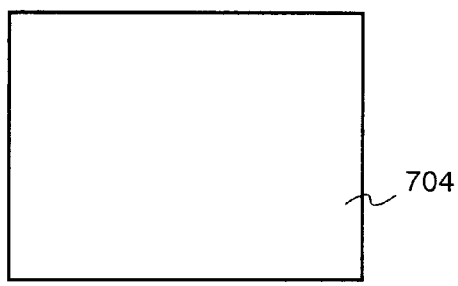
FIGS. 18A to 18E are diagrams showing the process of manufacturing the active matrix substrate.
Figure 19A:
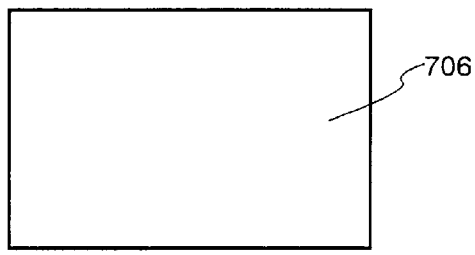
FIGS. 19A to 19E are diagrams showing the process of manufacturing the active matrix substrate.

Island shape semiconductor layers 704 to 706 having a first shape, as shown by the dotted lines in FIG. 15B, are then formed from the semiconductor layer 703 having an amorphous structure. FIG. 18A is a top view of the island shape semiconductor layer 704 in this state, and similarly, FIG. 19A shows a top view of the island shape semiconductor layer 706.

The island shape semiconductor layers are formed with a rectangular shape and with the length of one side equal to or less than 50 μm in FIGS. 18A to 19E, but it is possible to form the island shape semiconductor layers having an arbitrary shape, and any polygonal shape or circular shape can be used, provided that the minimum distance from the center portion to the edge portion is preferably equal to or less than 50 μm.

A crystallization process is performed next with respect to the island shape semiconductor layers 704 to 706. It is possible to use either method explained by embodiment mode 1 or embodiment mode 2, but laser annealing is performed on the island shape semiconductor layers 704 to 706 by the method of embodiment mode 1 in embodiment 6. Island shape semiconductor layers 707 to 711 are thus formed from the crystalline silicon films shown by the solid lines of FIG. 15B.

Note that an example of forming one island shape semiconductor layer corresponding to two TFTs is shown in embodiment 6, but for cases in which the exclusive surface area of the island shape semiconductor layer becomes large (when the size of one TFT becomes large), it is possible to partition the island shape semiconductor layer into a plurality of island shape semiconductor layers, connect a plurality of TFTs in series, and make the plurality of TFTs function as a single TFT.

Figure 18B:
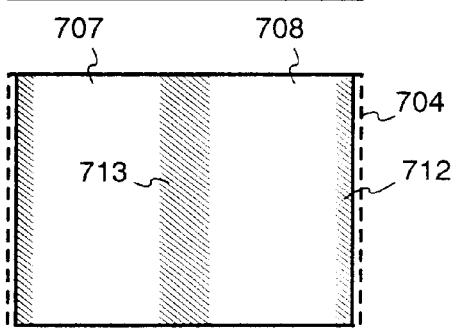
Figure 19B:
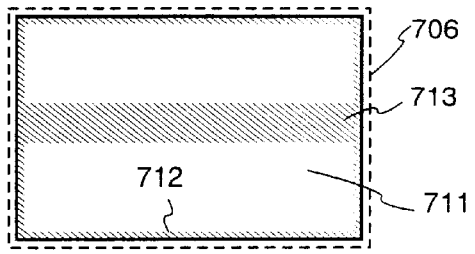

Accompanying the crystallization of the amorphous semiconductor film at this point, the film becomes dense and shrinks on the order of 1 to 15%. Regions 712 in which distortion develops due to the shrinkage in the edge portions of the semiconductor layers are then formed. In addition, small grain size regions (regions in which the average grain size is small) 713 are formed in the center portion of the island shape semiconductor layers. FIGS. 18B and 19B show top views of the respective island shape semiconductor layers in this state. Regions 704 and 706, shown by dotted lines in the same figures, show the size of the original island shape semiconductor layers 704 and 706.

If channel forming regions are contained in the region 712, in which distortions have accumulated, or the small grain size region 713, then this becomes a cause of deterioration of the TFT characteristics due to multiple defect levels. For example, this is not desirable because the off current value increases, and current flow is concentrated in this region causing localized heating.

Figure 19C:
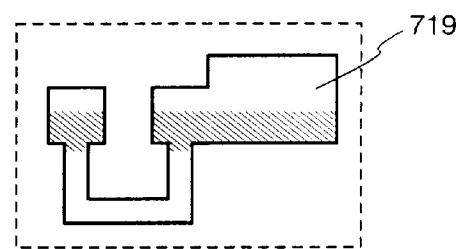

Therefore, as shown in FIG. 15C, second shape island shape semiconductor layers 715 and 716 are formed so as to eliminate the regions stated above. However, in a source region, a drain region, and a region which works as an electrode of a storage capacitor, the above small grain size region 713 is included for the case of the island shape semiconductor layer 719 which becomes the active layer of the pixel TFT, as shown in FIG. 19C. This type of small grain size region does not become a problem provided that it is not contained in the channel forming region.

Figure 18C:
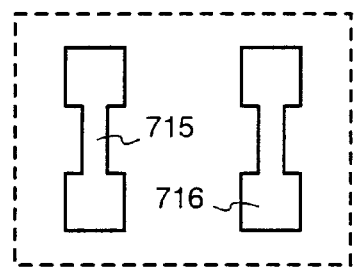

Note that reference numeral 714', shown by dotted lines in the figures, denotes regions in which the accumulated distortion regions 712 and the small grain regions 713 exist, and that the second shape island shape semiconductor layers 715, 716, and 719 are shown in a state of being formed on the inside of that region. The second shape island shape semiconductor layers 715, 716, and 719 may be formed in arbitrary shapes. A top view of the island shape semiconductor layers 715 and 716 in this state is shown in FIG. 18C. Further, a top view of the island shape semiconductor layer 719 is similarly shown in FIG. 19C.

A mask layer 720 is formed next by a silicon oxide film with a thickness of 50 to 100 nm by plasma CVD or sputtering, covering the island shape semiconductor layers 715 to 719. An impurity element which imparts p-type conductivity is added at a concentration of $1\times10^{16}$ to $5\times10^{17}$ atoms/cm$^3$ to the entire surface of the island shape semiconductor layers with the aim of controlling the threshold voltage ($V_{th}$) of the TFTs.

Periodic table group 13 elements such as boron (B), aluminum (Al), and gallium (Ga) are known as impurity elements which impart p-type conductivity with respect to semiconductors. Ion injection and ion doping can be used as the addition method, but the ion doping method is suitable for processing large surface area substrates. Boron (B) is added with ion doping by using diborane (B$_2$H$_6$) as a source gas. This type of impurity element injection is not always necessary and omitting the impurity element will not cause interference, but the impurity element is particularly effective in containing the threshold voltage of the n-channel TFT within a preset range.

In order to form an LDD region of the n-channel TFT of the driver circuit, an impurity element which imparts n-type conductivity is selectively added to the island shape semiconductor layers 716 and 718. Resist masks 721a to 721e are formed in advance in order to do so. Phosphorous (P) or arsenic (As) may be used as the n-type conductivity imparting impurity element, and phosphorous (P) is added here by ion doping using phosphine (PH$_3$).

The impurity regions formed are denoted by low concentration n-type impurity regions 722 and 723, and the phosphorous (P) concentration may be in the range of $2\times10^{16}$ to $5\times10^{19}$ atoms/cm$^3$. The concentration of the n-type conductivity imparting impurity element contained in the impurity regions 722 and 723 formed here is referred to as "n$^-$" throughout this specification. Further, an impurity region 724 is a semiconductor layer for forming the storage capacitor of the pixel portion, and phosphorous (P) is also added to this region at the same concentration. (See FIG. 15D.)

A process of activating the added impurity elements is performed next. The activation is performed by heat treatment for 1 to 4 hours at between 500 and 600° C. in a nitrogen atmosphere, or by laser activation. Further, both methods may be performed in combination. When performing laser activation, KrF excimer laser light (wavelength 248 nm) is used, a linear shape beam is formed, with an emission frequency of 5 to 50 Hz and an energy density of 100 to 500 mJ/cm$^2$, and the linear shape beam is scanned at an overlap ratio of between 80 and 98%, processing the entire surface of the substrate on which the island shape semiconductor layers are formed. Note that there are no limitations on the irradiation conditions of the laser light, and that they may be suitably determined by the operator. This process may be performed with the mask layer 720 remaining, or may be performed after removing the mask layer 720.

In FIG. 15E, a gate insulating film 725 is formed by an insulating film containing silicon with a film thickness of 40 to 150 nm by using plasma CVD or sputtering. For example, it may be formed from a 120 nm thick silicon oxynitride film. Further, a silicon oxynitride film manufactured by adding O$_2$ to SiH$_4$ and N$_2$O has a reduced fixed electric charge density throughout the film, and therefore this is a desirable material to use. Of course, the gate insulating film 725 is not limited to this type of silicon oxynitride film, and other insulating films containing silicon may also be used, in a single layer structure or a lamination structure. Whichever is used, considering the substrate, the gate insulating film 725 is formed so as to have a compressive stress.

Then, as shown in FIG. 15E, a heat resistant conducting layer is formed on the gate insulating film 725 in order to form a gate electrode. The heat resistant conducting layer may be formed by a single layer, but if necessary, may also be formed by a lamination structure made from a plurality of layers, such as a two layer or three layer structure. Using these types of heat resistant conducting materials, a structure of a lamination of, for example, a conducting layer (A) 726 made from a conducting metallic nitride film and a conducting layer (B) 727 made from a metallic film may be used.

The conducting layer (B) 727 may be formed from an element selected from the group consisting of tantalum (Ta), titanium (Ti), molybdenum (Mo), and tungsten (W); or from an alloy containing one of these elements as its main constituent; of from an alloy film of a combination of these elements (typically an Mo—W alloy film or an Mo—Ta alloy film). The conducting layer (A) 726 may be formed by a film such as a tantalum nitride film (TaN), a tungsten nitride film (WN), a titanium nitride film (TiN), or a molybdenum nitride film (MoN). Further, a tungsten silicide, a titanium silicide, or a molybdenum silicide may also be applied to the conducting layer (A) 726.

Furthermore, in order to make the conducting layer (B) 727 low resistance, it is preferable to reduce the impurity concentration, and in particular, it is preferable to make the oxygen concentration equal to or less than 30 ppm. For example, by making the oxygen concentration equal to or less than 30 ppm, tungsten (W) can realize a low resistivity value equal to or less than 20 $\mu\Omega$cm.

The conducting layer (A) 726 may be from 10 to 50 nm thick (preferably between 20 and 30 nm), and the conducting layer (B) 727 may be from 200 to 400 nm thick (preferably between 250 and 350 nm). When W is used as the gate electrode, sputtering is performed using a W as a target, and a 50 nm thick tungsten nitride (WN) is formed as the conducting layer (A) 726 by introducing argon (Ar) and nitrogen (N$_2$) gasses, and 250 nm thick W is formed as the conducting layer (B) 727. As for other methods, the W film can also be formed by thermal CVD using tungsten hexafluoride (WF$_6$).

Whichever method is used, it is necessary to make the film low resistance in order to be used as the gate electrode, and it is preferable that the resistivity of the W film be equal to or less than 20 $\mu\Omega$cm. By making the grains of the W film larger, it is possible to make the film low resistance, but when there are many impurity elements within the W film, such as oxygen, crystallization is obstructed and the film becomes high resistance. Thus a w target having 99.9999% purity is used when sputtering, and in addition, by forming the W film with sufficient consideration so that impurity elements within the gas phase do not mix in during film deposition, a resistivity of 9 to 20 $\mu\Omega$cm can be realized.

In addition, when using a TaN film in the conducting layer (A) 726 and a Ta film in the conducting layer (B) 727, it is also possible to form them similarly by sputtering. The TaN film is formed by sputtering using a Ta target and using a gas mixture of Ar and nitrogen, and the Ta film is formed by sputtering using Ar as the sputtering gas. Further, if a suitable amount of Xe or Kr is added to the sputtering gas, then the internal stress of the film formed can be relieved and peeling of the film can be prevented. The resistivity of an α-phase Ta film is on the order of 20 $\mu\Omega$cm, and can be used as the gate electrode, but the resistivity of a β-phase Ta film is on the order of 180 $\mu\Omega$cm, and is unsuitable as the gate electrode. The TaN film possesses a crystal structure which is close to an α-phase, and therefore if the Ta film is formed on top of the TaN film, an α-phase Ta film can easily be obtained.

Note that, although not shown in the figures, it is effective to form a silicon film doped with phosphorous (P) and having a thickness on the order of 2 to 20 nm under the conducting layer (A) 726. Along with an increase in the adhesion of the conducting film formed on top and the ability to prevent oxidation, alkaline metallic elements contained in microscopic amounts in the conducting layer (A) 726 and the conducting layer (B) 727 can be prevented from diffusing into the gate insulating film 725 by doing so. In any case, it is preferable for the conducting layer (B) 727 to have a resistivity with the range of 10 to 50 $\mu\Omega$cm.

A photomask is used next and resist masks 728a to 728f are formed using a photolithography technique. The conducting layer (A) 726 and the conducting layer (B) 727 are etched at the same time, forming gate electrodes 729 to 733 and a capacitor wiring 734. The gate electrodes 729 to 733 and the capacitor wiring 734 are formed as single bodies from regions 729a to 733a made from the conducting layer (A) and regions 729b to 733b made from the conducting layer (B). (See FIG. 16A.)

Figure 18D:
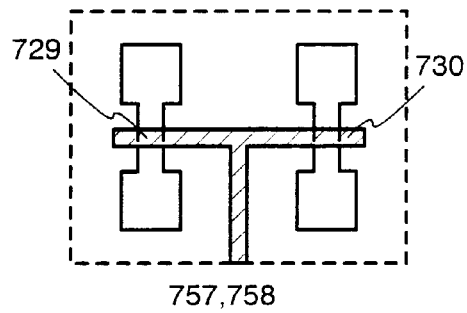
Figure 19D:
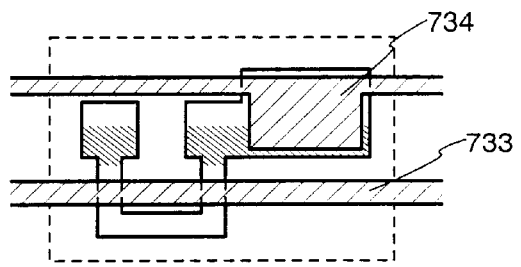

Further, the positional relationship in this state between the island shape semiconductor layers 715 and 716, and the gate electrodes 729 and 730 is shown in FIG. 18D. Similarly, the relationship between the island shape semiconductor layer 719 and the gate electrode 733 with the capacitor wiring 734 is shown in FIG. 19D. The gate insulating film 725 is omitted in FIG. 18D and in FIG. 19D.

The method of etching the conducting layer (A) and the conducting layer (B) may be suitably chosen by the operator, but when a material having W as its main constituent is formed, then it is preferable to apply a dry etching method using a high density plasma in order to perform etching at high speed and with good precision. A microwave plasma or inductively coupled plasma (ICP) etching apparatus may be used as a method of obtaining the high density plasma.

For example, in a tungsten etching method using an ICP etching apparatus, two types of gases, $CF_4$ and $Cl_2$, are introduced into a reaction chamber, and high frequency (13.56 MHz) electric power of 200 to 1000 W is applied to an inductively coupled portion with the pressure set between 0.5 and 1.5 Pa (preferably 1 Pa). By placing high frequency electric power at 20 W to the stage on which the substrate is placed at this time, and electrifying with a self-biased, negative electric potential, positive ions are accelerated and etching can be performed in an anisotropic manner. By using the ICP etching apparatus, an etching speed of 2 to 5 nm/sec can be obtained for hard metallic films such as W. Further, in order to perform etching without any residue remaining, over etching may be performed by increasing the etching time on the order of 10 to 20%. However, it is necessary to be careful of the etching selectivity with the base at this time. For example, the etching selectivity of a silicon oxynitride film (the gate insulating film 725) with respect to a W film is from 2.5 to 3, and therefore the silicon oxynitride film in practice becomes thinner on the order of 20 to 50 nm on exposed surfaces by this type of over etching processing.

In order to then form an LDD region in the n-channel TFT of the pixel TFT, a process of adding an impurity element which imparts n-type conductivity is performed ($n^+$ doping process). The impurity element which imparts n-type conductivity may be added by ion doping in a self-aligning manner with the gate electrodes 729 to 733 as masks. Phosphorous (P) is added as the n-type conductivity imparting impurity element at a concentration in the range of $1\times10^{16}$ to $5\times10^{19}$ atoms/cm$^3$. Low concentration n-type impurity regions 735 to 739 are thus formed in the island shape semiconductor layers, as shown in FIG. 16B.

Formation of a high concentration n-type impurity region, which functions as a source region or a drain region, in the n-channel TFT is performed next ($n^+$ doping process). First, resist masks 740a to 740d are formed using a photomask, and an impurity element which imparts n-type conductivity is added, forming high concentration n-type impurity regions 741 to 746. Phosphorous (P) is used as the n-type conductivity imparting impurity element, and ion doping is performed using phosphine ($PH_3$) so that the phosphorous (P) concentration is in the range of $1\times10^{20}$ to $1\times10^{21}$ atoms/cm$^3$. (See FIG. 16C.)

High concentration p-type impurity regions 748 and 749 are then formed as source regions or drain regions in the island shape semiconductor layers 715 and 717 forming the p-channel TFT. An impurity element which imparts p-type conductivity is added here with the gate electrodes 729 and 731 as masks, forming the high concentration p-type impurity regions in a self-aligning manner. The entire surfaces of the island shape semiconductor films 716, 718, and 719 forming the n-channel TFT are covered at this point by resist masks 747a to 747c formed using a photomask.

This the high concentration p-type impurity regions 748 and 749 are formed by ion doping using diborane ($B_2H_6$). The boron (B) concentration of these regions is set to be from $3\times10^{20}$ to $3\times10^{21}$ atoms/cm$^3$ (FIG. 16D).

Phosphorous is added to the high concentration p-type impurity regions 748 and 749 in the previous process, and a phosphorous concentration of $1\times10^{20}$ to $1\times10^{21}$ atoms/cm$^3$ is contained in high concentration p-type impurity regions 748a and 749a, while phosphorous is contained in high concentration p-type impurity regions 748b and 749b at a concentration of $1\times10^{16}$ to $5\times10^{19}$ atoms/cm$^3$, but by setting the boron (B) concentration added in this process to be from 1.5 to 3 times the concentration of phosphorous contained in these regions, they can function as source regions and drain regions of the p-channel TFT without any problem.

Next, as shown in FIG. 17A, a protecting insulating film 750 is formed on the gate electrode and the gate insulating film. A silicon oxide film, a silicon oxynitride film, a silicon nitride film, or a lamination film of a combination of these films may be formed as the protecting insulating film. Whatever is used, the protecting insulating film 750 is formed from an inorganic insulating material. The film thickness of the protecting insulating film 750 is set between 100 and 200 nm.

When using a silicon oxide film here, it can be formed by plasma CVD using a mixture of tetraethyl orthosilicate (TEOS) and $O_2$, a reaction pressure of 40 Pa, a substrate temperature of 300 to 400° C., and emitting a high frequency (13.56 MHz) power density of 0.5 to 0.8 W/cm². For the case of using a silicon oxynitride film, a silicon oxynitride film manufactured by plasma CVD using $SiH_4$, $N_2O$ and $NH_3$, or a silicon oxynitride film manufactured by plasma CVD using $SiH_4$ and $N_2O$ may be formed. In this case the film can be formed with manufacturing conditions of a reaction pressure set 20 to 200 Pa, a substrate temperature between 300 and 400° C., and a high frequency (60 MHz) power density of 0.1 to 1.0 W/cm². Furthermore, a hydrogenated silicon oxynitride film manufactured by $SiH_4$, $N_2O$ and $H_2$ may also be applied. It is also possible to manufacture a silicon nitride film similarly from $SiH_4$ and $NH_3$ by plasma CVD. Considering the substrate, this type of protecting insulating film is formed so as to have a compressive stress.

A process of activating the n-type conductivity and p-type conductivity imparting impurity elements added at their respective concentrations is performed next. This process is performed by furnace annealing using an electric furnace. In addition, laser annealing or rapid thermal annealing (RTA) can also be applied. It is preferable to perform furnace annealing in an atmosphere in which the concentration of oxygen is equal to or less then 1 ppm, preferably equal to or less then 0.1 ppm, at a temperature of 400 to 700° C., typically from 500 to 600° C., and heat treatment is performed for 4 hours at 550° C. in embodiment 6. Further, when a plastic substrate having a low heat resistance temperature is used as the substrate 701, laser annealing is used. (See FIG. 17B.)

After the activation process, additional heat treatment is performed at 300 to 450° C. for 1 to 12 hours in an atmosphere containing between 3 and 100% hydrogen, performing hydrogenation of the island shape semiconductor layers. This process is one of terminating dangling bonds in the island shape semiconductor layers by hydrogen which is thermally excited. Plasma hydrogenation (using hydrogen excited by a plasma) may also be performed as another means of hydrogenation. Furthermore, provided that the heat resistance of the substrate 701 permits it, hydrogen in the hydrogenated silicon oxynitride film 702b of the base film 702, and hydrogen in the silicon oxynitride film of the protecting insulating film 750 can be made to diffuse by heat treatment between 300 and 450° C., hydrogenating the island shape semiconductor layers.

After completing the activation and hydrogenation processes, an interlayer insulating film 751 made from an organic insulator is formed having an average thickness of 1.0 to 2.0 μm. Materials such as polyimide, acrylic, polyamide, polyimide amide, and BCB (benzocyclobutene) can be used as the organic insulator. For example, when a heat setting type polyimide is used, the interlayer insulating film is formed by baking at 300° C. in a clean oven after application to the substrate. Further, when acrylic is used, two liquids are used, and after combining a main material and a hardening agent, and after then applying this over the entire surface of the substrate using a spinner, pre-heat treatment is performed for 60 seconds at 80° C. on a hot plate, and in addition, the substrate is fired for 60 minutes at 250° C. in a clean oven, forming the interlayer insulating film.

The surface can be made very level by forming the interlayer insulating film by an organic insulator. Further, organic insulators generally have a low dielectric constant, and therefore parasitic capacitance can be reduced. However, organic insulators are absorbent with respect to moisture and their effect as protecting films is weak, and therefore it is also preferable to use a combination of films such as a silicon oxide film, a silicon oxynitride film, and a silicon nitride film formed as the protecting insulating film 750, as in embodiment 6.

A resist mask having a predetermined pattern is formed next using a photomask, and contact holes for reaching the source region or the drain region formed in the respective island shape semiconductor films are formed. The formation of the contact holes is performed by dry etching. In this case, the interlayer insulating film 751 made from an organic insulator is etched first using a mixed gas of $CF_4$, $O_2$, and He as the etching gas, and the protecting insulating film 750 is etched afterward with $CF_4$ and $O_2$ as the etching gas. In addition, by switching the etching gas to $CHF_3$ and etching the gate insulating film 725 in order to increase the selectivity with respect to the island shape semiconductor layers, good contact holes can be formed.

A metallic conducting film is then formed by sputtering or vacuum evaporation, and a resist mask is formed from a photomask. By then performing etching, source wirings 752 to 756 and drain wirings 757 to 761 are formed. A drain wiring 762 shows a drain wiring of an adjacent pixel. The drain wiring 761 also functions as a pixel electrode. Although not shown in the figures, in embodiment 6 the electrodes, made into wirings, are formed by a Ti film with a thickness of 50 to 500 nm, forming contacts with the semiconductor films forming the source or drain regions of the island shape semiconductor layers, and an aluminum (Al) film with a thickness of 300 to 400 nm is formed on top of the Ti film.

Figure 18E:
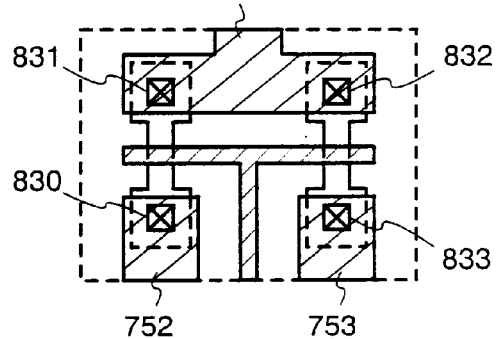

FIG. 18E shows a top view of the island shape semiconductor layers 715 and 716, the gate electrodes 729 and 730, the source wirings 752 and 753, and the drain wirings 757 and 758 in this state. The source wirings 752 and 753 are connected to the island shape semiconductor layers 715 and 716, through contact holes, which are not shown in the figures, formed in the interlayer insulating film and the protecting insulating film, by reference numerals 830 and 833, respectively. Further, the drain wirings 757 and 758 are connected to the island shape semiconductor layers 715 and 716 by reference numerals 831 and 832.

Figure 19E:
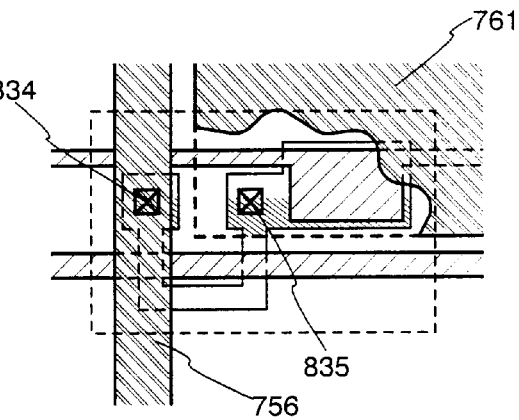

Similarly, a top view of the island shape semiconductor layer 719, the gate electrode 733, the capacitor wiring 734, the source wiring 756, and the drain wiring 761 are shown in FIG. 19E, and the source wiring 756 and the drain wiring 761 are connected to the semiconductor layer 719 by a contact portion 834 and a contact portion 835, respectively.

In any case, the island shape semiconductor layers having the second shape are formed in the region inside the island shape semiconductor layers having the first shape, excluding the region in which distortions remain, and the TFT are formed.

If hydrogenation process is performed in this state, then a desirable result is obtained with respect to increasing the TFT characteristics. For example, heat treatment may be performed in an atmosphere containing between 3 and 100% hydrogen for 1 to 12 hours at 300 to 450° C., and a similar effect is also obtained by using a plasma hydrogenation method. Further, the hydrogen which exists in the protecting insulating film 750 and in the base film 702 can be made to diffuse and be hydrogenated into the island shape semiconductor films 715 to 719 by this type of heat treatment. Whichever method is used, it is preferable to make the defect density in the island shape semiconductor layers 715 to 719 equal to or less than $10^{16}/cm^3$, and it is preferable to give hydrogen a concentration on the order of $5\times10^{18}$ and $5\times10^{19}$ atoms/cm$^3$ in order to do so. (See FIG. 17C.)

The substrate having the driver circuit TFTs and the pixel TFTs of the pixel portion on the same substrate can thus be completed. A first p-channel TFT 800, a first n-channel TFT 801, a second p-channel TFT 802, a second n-channel TFT 803 are formed in the driver circuit, and a pixel TFT 804 and a storage capacitor 805 are formed in the pixel portion. For convenience, this type of substrate is referred to as an active matrix substrate throughout this specification.

The first p-channel TFT 800 of the driver circuit is a structure having a channel forming region 806, and source regions 807a and 807b, and drain regions 808a and 808b, made from high concentration p-type impurity regions in the island shape semiconductor film 715.

The first n-channel TFT 801 has a channel forming region 809, an LDD region 810 overlapping the gate electrode 730, a source region 812, and a drain region 811 in the island shape semiconductor film 716. The length of the LDD region overlapping the gate electrode 730 in the longitudinal direction of the channel is set from 0.5 to 3.0 μm, preferably from 1.0 to 2.0 μm. By making the length of the LDD region in the n-channel TFT as stated, a high electric field which develops near the drain region is relieved, the generation of hot carriers is prevented, and deterioration of the TFT can be prevented.

The second p-channel TFT 802 of the driver circuit similarly has a single drain structure having a channel forming region 813, and source regions 814a and 814b, and drain regions 815a and 815b, made from high concentration p-type impurity regions in the island shape semiconductor film 717.

A channel forming region 816, LDD regions 817 and 818 overlapping with a portion of the gate electrode 732, a source region 820, and a drain region 819 are formed in the island shape semiconductor film 718 in the second n-channel TFT 803. The length of the LDD regions overlapping the gate electrode 732 of this TFT is set from 0.5 to 3.0 μm, preferably between 1.0 and 2.0 μm. Furthermore, the length, in the longitudinal direction of the channel, of the LDD region not overlapping with the gate electrode is set from 0.5 to 4.0 μm, preferably between 1.0 and 2.0 μm.

The pixel TFT 804 has channel forming regions 821 and 822, LDD regions 823 to 825, and source or drain regions 826 to 828 in the island shape semiconductor film 719. The length of the LDD region in the longitudinal direction of the channel is from 0.5 to 4.0 μm, preferably from 1.5 to 2.5 μm. In addition, the storage capacitor 805 is formed from the capacitor wiring 734, an insulating film made from the same material as the gate insulating film, and a semiconductor layer 829 connected to the drain region 828 of the pixel TFT 804. The pixel TFT 804 is shown with a double gate structure in FIG. 17C, but a single gate structure may also be used, and a multi-gate structure in which a plurality of gate electrodes are formed will not interfere.

Figure 20:
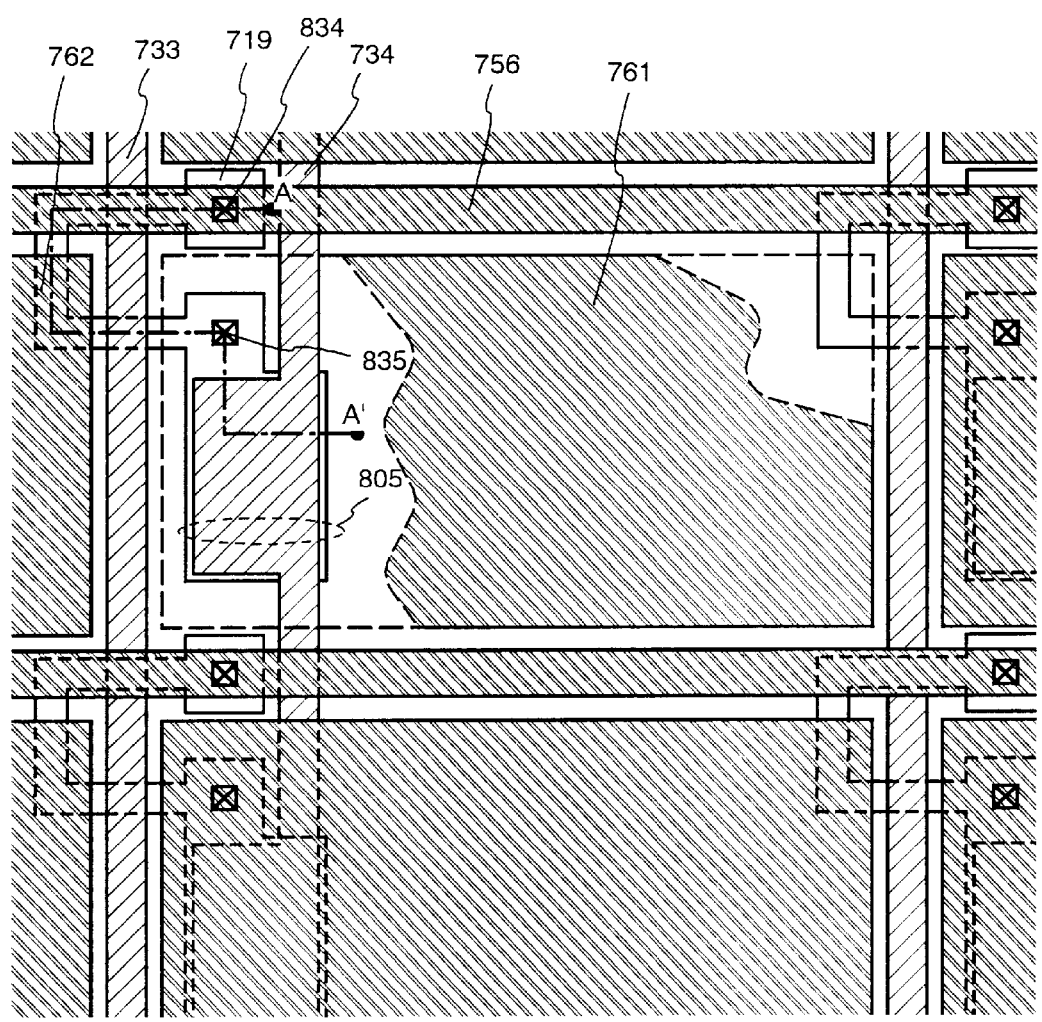
FIG. 20 is a diagram showing the structure of a pixel.

FIG. 20 is a top view showing nearly one pixel of the pixel portion. A cross section along the line A–A' shown in the diagram corresponds to the cross sectional diagram of the pixel portion shown in FIG. 17C. The gate electrode 733 of the pixel TFT 804 intersects, through the gate insulating film not shown in the figure, with the island shape semiconductor layer 719 under the gate insulating film. Source regions, drain regions, and LDD regions are formed in the island shape semiconductor layers, although not shown in the figure. Further, reference numeral 834 denotes the contact portion of the source wiring 756 and the source region 826, and reference numeral 835 denotes the contact portion of the source wiring 756 and the source region 826. The storage capacitor 805 is formed by a region in which the semiconductor layer 829, extending from the drain region 828 of the pixel TFT 804, overlaps the capacitor wiring 734 through the gate insulating film.

The active matrix substrate is thus completed. TFTs having appropriate structures corresponding to the specifications of the pixel portion and the driver circuit are arranged in the active matrix substrate manufactured in accordance with embodiment 6. It is therefore possible to increase the operating performance and the reliability of an electro-optic device which uses the active matrix substrate.

Note that the drain wiring 761 of the pixel TFT 804 is used, as is, as the pixel electrode in embodiment 6, which becomes a structure corresponding to a reflecting type liquid crystal display device. However, by forming the pixel electrode from a transparent conducting film electrically connected to the drain wiring 761, the structure can also correspond to a transmitting type liquid crystal display device.

Furthermore, embodiment 6 is one example of a process of manufacturing a semiconductor device using the present invention, and it is not necessary to place limitations on the materials and range of numerical values shown in embodiment 6. In addition, things such as the arrangement of the LDD regions may be suitably determined by the operator.

Embodiment 7

A process of manufacturing an active matrix type liquid crystal display device from the active matrix substrate manufactured in accordance with embodiment 6 is explained in embodiment 7. First, as shown in FIG. 21A, spacers 901a to 901f made from a resin material are formed in the active matrix substrate in the state of FIG. 17C by patterning. Note that a material such as a known spheroidal silica can be dispersed and used as the spacers.

In embodiment 7, JSR Corp. manufactured NN700 is used as the resin material spacers 901a to 901f, and after applying this by using a spinner, a predetermined pattern is formed by exposure and development processes. In addition, this is hardened by heat treatment at 150 to 200° C. in an oven such as a clean oven. Spacers thus manufactured can be made to differ in shape in accordance with the exposure and development process conditions, but, preferably, if the shape is columnar with a level top, then the mechanical strength as a liquid crystal display panel can be maintained during alignment of the substrate with an opposing substrate.

Further, there are no special limitations on conic or pyramidal shapes, and specifically, when a conic shape is used, for example, with a height H of 1.2 to 5 μm, an average radius L1 of between 5 and 7 μm, the ratio of the average radius L1 to the radius of the base L2 is set to 1:1.5. The absolute value of the taper angle of the side surface is equal to or less than 15° at this time.

The arrangement of the spacers 901a to 901f may be arbitrarily determined, but as shown in FIG. 21A, in the pixel portion it is preferable to form them so as to overlap and cover the contact portion 835 of the drain wiring 761 (pixel electrode). The contact portion 835 loses its evenness and the liquid crystals become unable to orient well in this portion, and by therefore filling the contact portion 835 with a resin for the spacers, things such as disclination can be prevented.

An alignment film 902 is formed next. A polyimide resin film is normally used in the alignment film of a liquid crystal display element. After forming the alignment film, a rubbing process is performed, orienting the liquid crystal molecules so as to possess a certain fixed pre-tilt angle. It is preferable to make the size of a region in which rubbing is not performed equal to or less than 2 µm, with respect to the rubbing direction, from the edge portions of the spacers 901a to 901f formed in the pixel portion. Further, the generation of static electricity during the rubbing process often becomes a problem, but if the spacers 901a to 901e are also formed on at least the source wirings and the drain wirings on the driver circuit TFTs, then in addition to the conventional role the spacers during the rubbing process, an effect of protecting the TFTs from static electricity, can be obtained.

A light shielding film 904, an opposing electrode 905 made from a transparent conducting film, and an alignment film 906 are formed on an opposing substrate 903. The light shielding film 904 is formed with a thickness of 150 to 300 nm from a material such as Ti, Cr, or Al. The active matrix substrate on which the pixel portion and the driver circuit are formed, and the opposing substrate are then joined together by using a sealing material 907. A filler 908 is mixed into the sealing material 907, and the opposing substrate and the active matrix substrate are joined together possessing a uniform gap in accordance with the filler 908 and the spacers 901a to 901f.

A liquid crystal material 909 is injected between both substrates, and this is completely sealed by using a sealant (not shown in the figures). As a liquid crystal material, a known liquid crystal material may be used. For example, in addition to a TN liquid crystal, a thresholdless antiferroelectric mixed liquid crystal displaying electro-optical response characteristics in which its transmittivity changes continuously with respect to an electric field can be used. There are also thresholdless antiferroelectric mixed liquid crystals which display V-type electro-optical response characteristics. The following may be referred to for details: Furue, H., et al., "Characteristics and Driving Scheme of Polymer-stabilized Monostable FLCD Exhibiting Fast Response Time and High Contrast Ration with Gray-scale Capability," SID, 1998; Yoshida, T., et al., "A Full-color Thresholdless Antiferroelectric LCD Exhibiting Wide Viewing Angle with Fast Response Time," SID 97 DIGEST, p. 841, 1997; Inui, S., et al., "Thresholdless Antiferroelectricity in Liquid Crystals and its Application to Displays, J. Mater. Chem., 6(4), pp. 671–3, 1996; and U.S. Pat. No. 5,594,569.

The active matrix type liquid crystal display device shown in FIG. 21B is thus completed. The spacers 901a to 901e are partitioned and formed on at least the source wirings and the drain wirings of the driver circuit TFTs in FIG. 21, but in addition, the spacers may be formed covering the entire surface of the driver circuit without causing interference.

Figure 22:
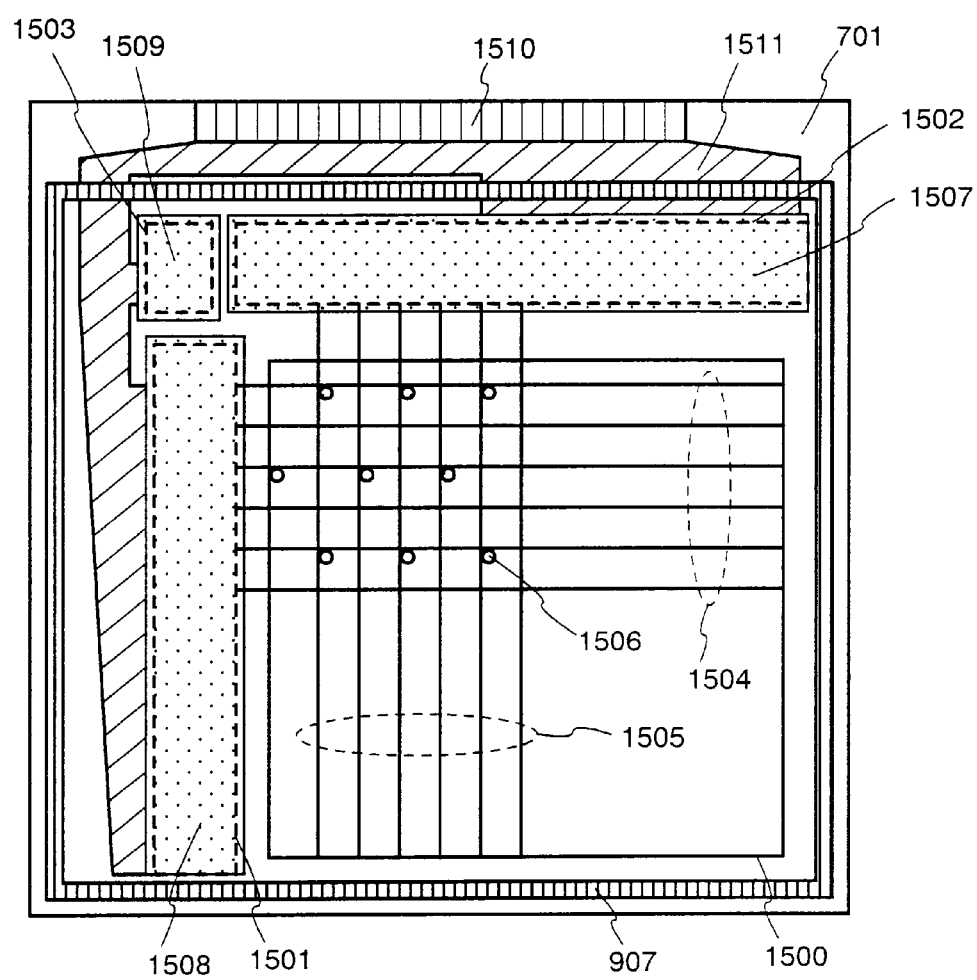
FIG. 22 is a diagram showing the top surface structure of an active matrix type liquid crystal display device.

FIG. 22 shows a top view of an active matrix substrate, and is a top view showing a positional relationship between a pixel portion and a driver circuit portion with spacers and a sealant. A scanning signal driver circuit 1501 and an image signal driver circuit 1502 are formed as driver circuits in the periphery of a pixel portion 1500. In addition, signal processing circuits 1503 such as a CPU or a memory may also be added.

The driver circuits are then connected to an external input-output terminal 1510 by connection wirings 1511. In the pixel portion 1500, a gate wiring group 1504 extending from the scanning signal driver circuit 1501, and a source wiring group 1505 extending from the image signal driver circuit 1502 intersect in a matrix stage, forming pixels, and the pixel TFT 804 and the storage capacitor 805 are formed for each of the respective pixels.

A spacer 1506 formed in the pixel portion corresponds to the spacer 901f shown by FIG. 21, and spacers may be formed for all the pixels, but may also be formed from every several pixels to every several tens of pixels for the pixels arranged in the matrix state. In other words, the ratio of the number of spacers to the total number of pixels structuring the pixel portion may be set from 20 to 100%. Further, spacers 1507 to 1509 formed in the driver circuit portion may be formed covering the entire surface of the driver circuit portion, and may also be partitioned into a multiple number of spacers and formed in alignment with the source and drain wirings of each TFT, as shown by FIG. 21.

The sealant 907 is formed on the substrate 701 on the outside of the pixel portion 1500, the scanning signal control circuit 1501, the image signal control circuit 1502, and the other signal processing circuits 1503, and more to the inside than the external input-output terminal 1510.

Figure 23:
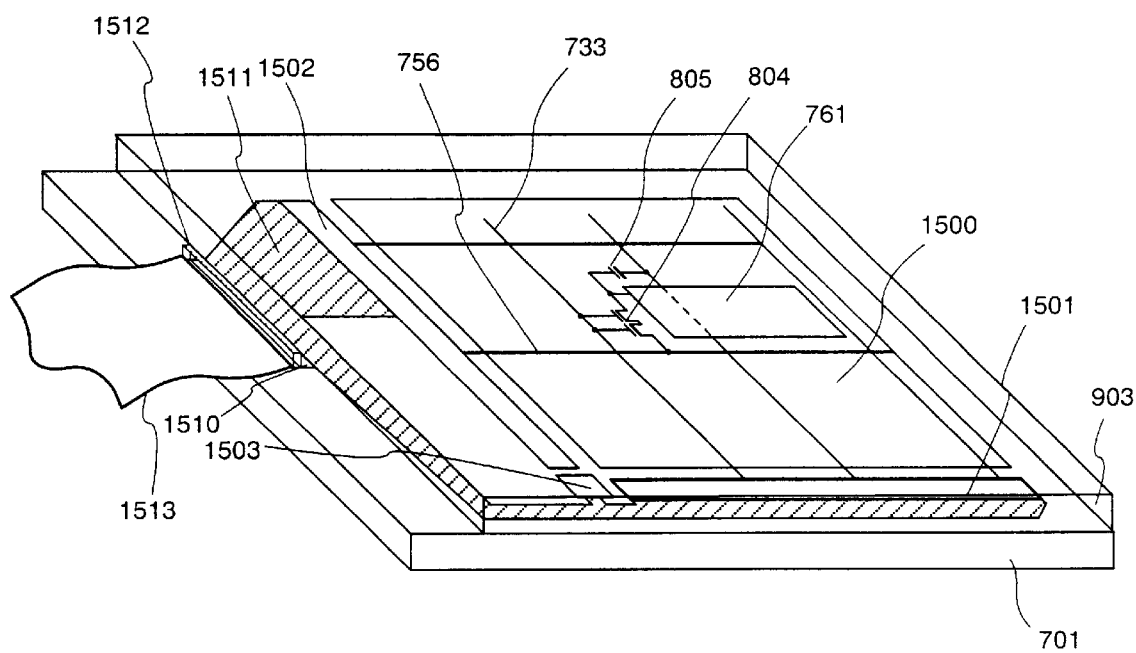
FIG. 23 is a perspective diagram of an active matrix type liquid crystal display device.

The composition of this type of active matrix type liquid crystal display device is explained using the perspective view of FIG. 23. The active matrix substrate in FIG. 23 is composed of the pixel portion 1500, the scanning signal driver circuit 1501, the image signal driver circuit 1502, and the other signal processing circuits 1503 formed on the glass substrate 701.

The pixel TFT 804 and the storage capacitor 805 are formed in the pixel portion 1500, and the driver circuit formed in the periphery of the pixel portion is structured by CMOS circuits as basic circuits. The scanning signal driver circuit 1501 and the image signal driver circuit 1502 are connected to the pixel TFT 804 by the gate wiring 733 and the source wiring 756, respectively. Further, a flexible printed circuit (FPC) 1513 is connected to the external input terminal 1510, and is used to input signals such as an image signal. The flexible printed circuit 1513 has its adhesion strength raised by a reinforcing resin 1512, and is fixed in place. Each of the respective driver circuits is then connected by connection wirings 1511. Further, although not shown in the figures, a light shielding film and a transparent electrode are formed on the opposing substrate 903.

A liquid crystal display device having this type of structure can be formed using the active matrix substrate shown by embodiment 6. For example, if an active matrix substrate with the structure of FIG. 17C is used, a reflecting type liquid crystal display device can be obtained, and as stated in embodiment 6, if an active matrix substrate using a transparent conducting film as a pixel electrode is employed, then a transmitting type liquid crystal display device can be obtained.

Embodiment 8

In embodiment 1 an example of crystallization by implementing laser annealing using the method shown in embodiment mode 1 or embodiment mode 2 on an amorphous semiconductor film is shown, but laser annealing can also be performed on a semiconductor film at a stage in which crystallization has advanced to a certain degree.

In other words, the laser annealing of the present invention is also effective for cases of crystallizing an amorphous semiconductor film by furnace annealing and then performing additional laser annealing on the obtained crystalline semiconductor film, improving its crystallinity.

Specifically, it is possible to use the laser annealing method of embodiment mode 1 and embodiment mode 3 for the laser irradiation process (laser annealing process) in patent applications such as Japanese Patent Application Laid-open No. 7-161634, Japanese Patent Application Laid-open No. 7-321339, and Japanese Patent Application Laid-open No. 7-131034.

Note that after using the present invention in the above patent applications, TFTs can be manufactured using the formed crystalline semiconductor film. Namely, it is possible to combine embodiment 8 with any of embodiments 4 to 7.

Embodiment 9

Examples of using the present invention for a liquid crystal display device are shown in embodiments 1 to 3, but provided that it is a semiconductor device using a TFT, it is possible to implement the present invention for all semiconductor devices.

Specifically, when manufacturing an active matrix type EL (electroluminescence) display device or an active matrix type EC (electrochromic) display device, it is possible to implement the present invention in a process of laser annealing of a semiconductor film. The structure of either embodiment mode 1 or embodiment mode 2 may be used when implementing the present invention.

In addition, the present invention can also be implemented when forming a load transistor of an SRAM used in an IC or an LSI. The present invention is also effective for cases of forming TFTs having a three dimensional structure on the IC or LSI.

The present invention is an invention of a laser annealing process portion, and therefore known TFT manufacturing processes can be applied to other portions. Therefore, when manufacturing the active matrix type EL display device or the active matrix type EC display device, the present invention may be applied to known techniques. Of course, it is also possible to manufacture the TFT with reference to the manufacturing process explained by FIGS. 15 to 17.

Embodiment 10

It is possible to implement the present invention in an electronic device (also referred to as electronic equipment) having an electro-optical device such as an active matrix type display device or an active matrix type EL display device as a display. The following can be given as examples of electronic devices; a personal computer, a digital camera, a video camera, a portable information terminal (such as a mobile computer, a portable telephone, or an electronic book), and a car navigation system.

FIG. 24A is a personal computer, composed of a main body 2001 having components such as a micro-processor and memory, an image input portion 2002, a display portion 2003, and a keyboard 2004. The present invention can be implemented when manufacturing the display portion 2003 and other signal processing circuits.

FIG. 24B is a video camera, and is composed of a main body 2101, a display portion 2102, a voice input portion 2103, operation switches 2104, a battery 2105, and an image receiving portion 2106. The present invention can be implemented when manufacturing the image portion 2102 and other signal controlling circuits.

FIG. 24C is a goggle type display, and is made from a main body 2201, a display portion 2202, and an arm portion 2203. The present invention can be implemented when manufacturing the display portion 2202 and other signal controlling circuits not shown in the figure.

FIG. 24D is electronic amusement equipment such as a television game or a video game, and is composed of a main body 2301 in which components such as an electric circuit 2308 containing elements such as a CPU, and a recording medium 2304 are installed; a display portion 2303; a controller 2305; and a display portion 2302 built into the main body 2301. The display portion 2303 and the display portion 2302 built into the main body 2301 may display the same information, or the former may be taken as a main display portion and the latter may be taken as a sub-display portion to display information from the recording medium 2304, display the operation state of the equipment, or to act as a control panel by adding a touch sensor function. Further, communication via wire may be used for mutual transfer of information between the main body 2301, the controller 2305, and the display portion 2303, or wireless communication, or communication via light, may be used by forming sensor portions 2306 and 2307. The present invention can be implemented when manufacturing the display portions 2302 and 2303. Further, a conventional CRT can also be used for the display portion 2303.

FIG. 24E is a player using a recording medium for recording a program (hereafter referred to as a recording medium), and is composed of a main body 2401, a display portion 2402, a speaker portion 2403, a recording medium 2404, and operation switches 2405. Note that a recording medium such as a DVD (digital versatile disc) or a compact disc (CD) is used as the recording medium, and that functions such as playback of a musical program, image display, playing of video games (or television games), and display of information via the Internet can be performed. The present invention can be implemented when manufacturing the display portion 2402 and other signal controlling circuits.

FIG. 24F is a digital camera, and is composed of a main body 2501, a display portion 2502, an eyepiece portion 2503, operation switches 2504, and an image receiving portion (not shown in the figure). The present invention can be implemented when manufacturing the display portion 2502 and other signal controlling circuits.

FIG. 25A is a front type projector, and is composed of an optical engine 2601 and a screen 2602. FIG. 25B is a rear projector, and is composed of a main body 2701, an optical engine 2702, a mirror 2703, and a screen 2704.

Note that one example of the structure of the optical engines (a system including a light source optical system or a display device) 2601 and 2702 of FIG. 25A and FIG. 25B is shown in FIG. 25C. The optical engines 2601 and 2702 are composed of a light source optical system 2801, mirrors 2802 and 2804 to 2806, a dichroic mirror 2803, a beam splitter 3807, a liquid crystal display device 2808, a phase difference plate 2809, and a projecting optical system 2810. The projecting optical system 2810 is composed of a plurality of optical lenses.

An example of a three plate type display using three of the liquid crystal display devices 2808 is shown in FIG. 25C, but there are no limitations placed on the structure, and it may also be structured by a single plate type optical system. Further, components such as a suitable optical lens, a film having a light polarizing function, a film for regulating the phase, and an IR film may be placed in the optical path shown by the arrow in FIG. 25C.

Furthermore, FIG. 25D is a diagram showing one example of the light source optical system 2801 in FIG. 25C. In embodiment 10, the light source optical system 2801 is composed of a reflector 2811, a light source 2812, lens arrays 2813 and 2814, a polarizing transformation element 2815, and a condenser lens 2816. Note that the light source optical system shown in FIG. 25D is one example, and the light source optical system is not limited to the structure shown in the figure.

In addition, although not shown in the figures here, the present invention can be implemented when manufacturing components such as a read-in circuit of a car navigation system or an image sensor. The applicable scope of the present invention is thus extremely wide, and the present invention can be implemented when manufacturing electronic devices of all fields.

Embodiment 11

Figure 27A:
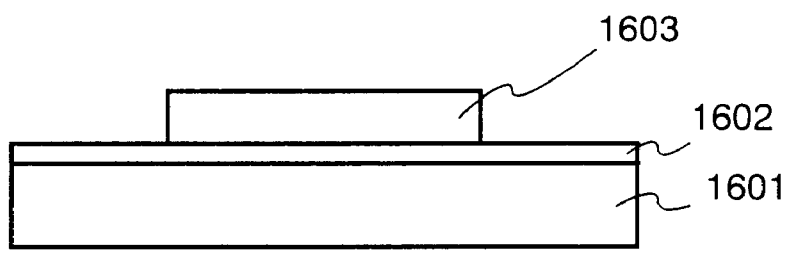
FIGS. 27A and 27B are SEM photographs showing a state of polysilicon film grains.
Figure 27B:
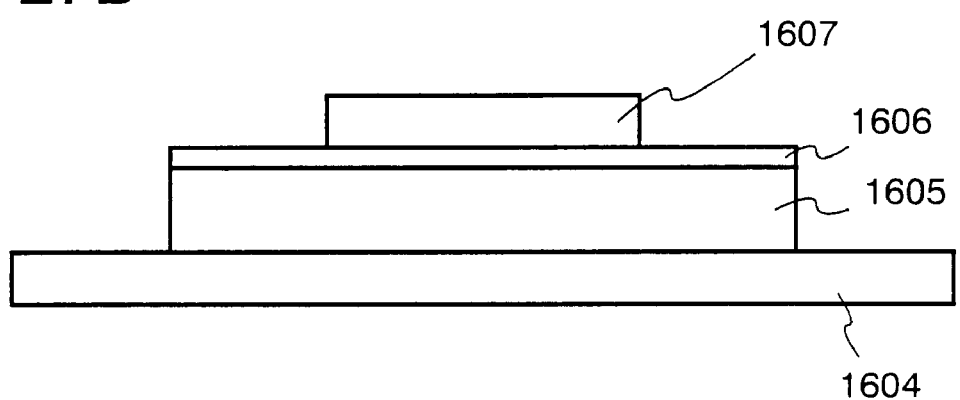

A case of irradiating laser light on the structures shown in FIGS. 27A and 27B at the conditions shown in embodiment 1 is explained in embodiment 11.

In the structure of FIG. 27A, reference numeral 1601 denotes a 1.1 mm thick quartz substrate, reference numeral 1602 denotes a 200 nm thick silicon oxynitride film, and 1603 denotes a 55 nm thick amorphous silicon film. Normal laser crystallization is performed on he structure of FIG. 27A.

Further, in FIG. 27B, reference numeral 1604 denotes a reflecting body whose surface (reflecting surface) is made from a tantalum nitride film, reference numeral 1605 denotes a 1.1 mm thick quartz substrate, 1606 denotes a 200 nm thick silicon oxynitride film, and 1607 denotes a 55 nm thick amorphous silicon film. Laser crystallization is performed on the structure of FIG. 27B by implementing the present invention.

Figure 28A:
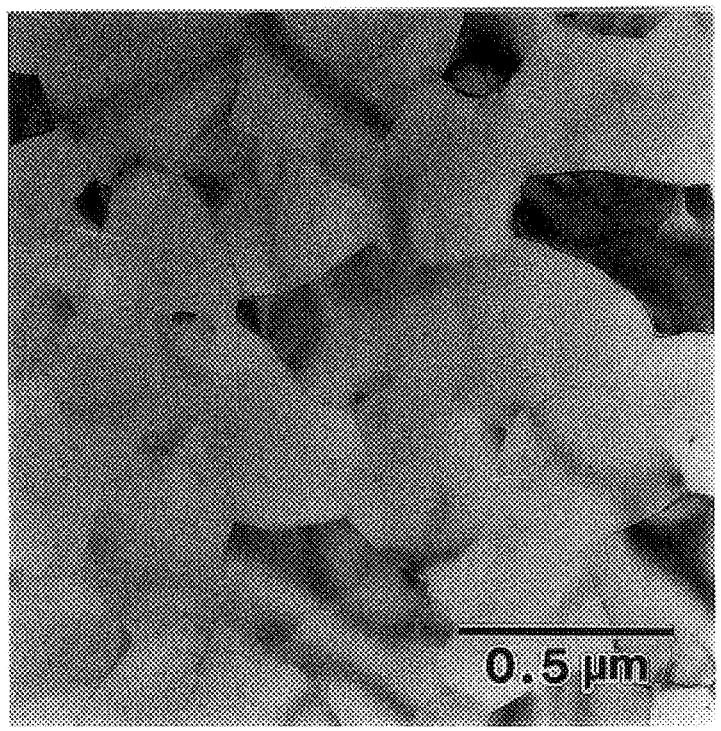
FIGS. 28A and 28B are TEM photographs showing a state of polysilicon film grains.
Figure 28B:
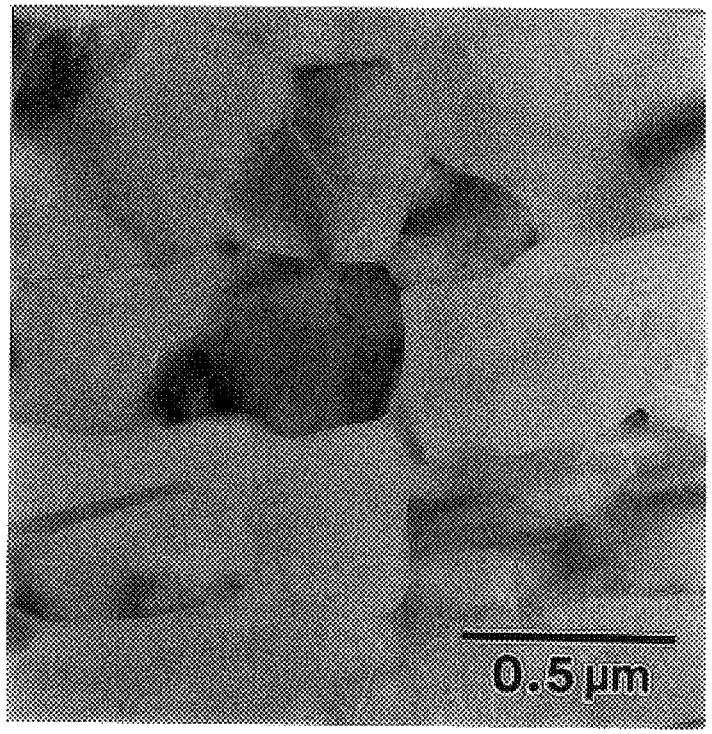

TEM (transmission electron microscopy) photographs of polysilicon films obtained as a result are shown in FIGS. 28A and 28B. FIG. 28A a TEM photograph of the polysilicon film obtained by crystallizing the amorphous silicon film 1603 in the structure of FIG. 27A, and FIG. 28B is a TEM photograph of the polysilicon film obtained by crystallizing the amorphous silicon film 1607 in the structure of FIG. 27B.

By comparing FIG. 28A and FIG. 28B, it can be confirmed that the polysilicon film of FIG. 28B obtained by implementing the present invention clearly has a large grain size. The fact that the average grain size of a crystalline semiconductor film can be increased by implementing the present invention can thus be confirmed from the TEM photographs.

Embodiment 12

Experiments performed by the applicant of the present invention show that when the effective energy strength ratio $(I_0'/I_0)$ satisfies the relationship $0<(I_0'/I_0)<1$ or $1<(I_0'/I_0)$, these are very good conditions for the existence of enlarged average grain size.

Figure 6:
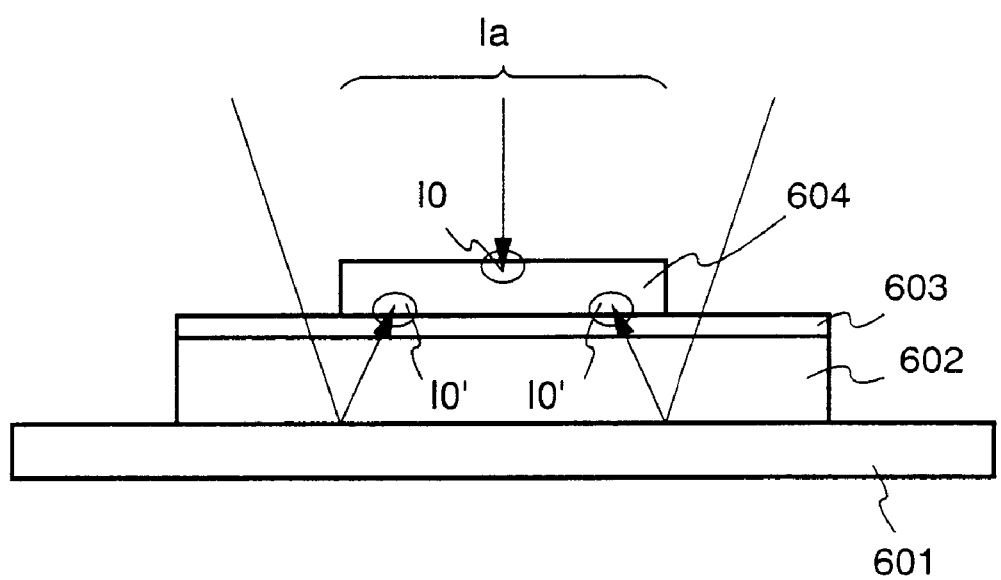
FIG. 6 is a diagram for explaining primary laser light and secondary laser light.
Figure 7A:
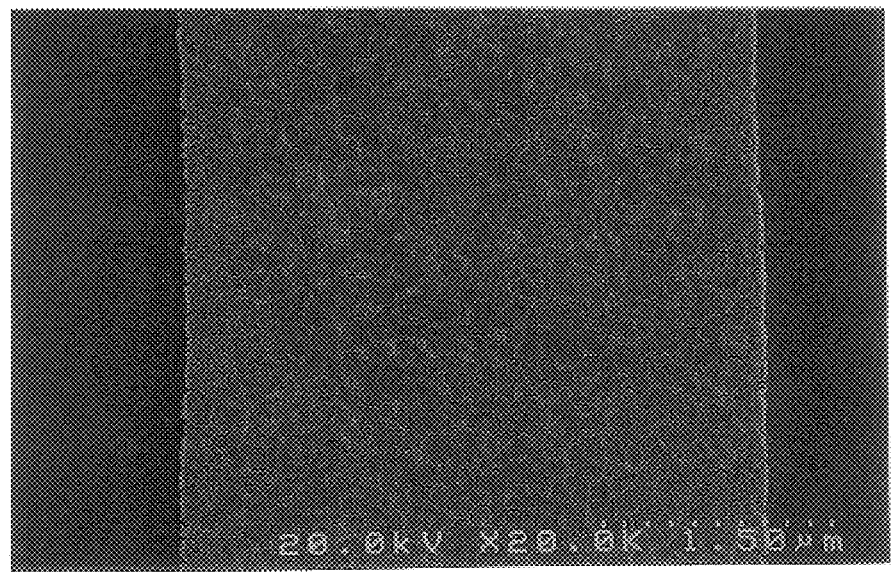
FIGS. 7A and 7B are SEM photographs showing a state of polysilicon film grains.
Figure 7B:
Figure 8A:
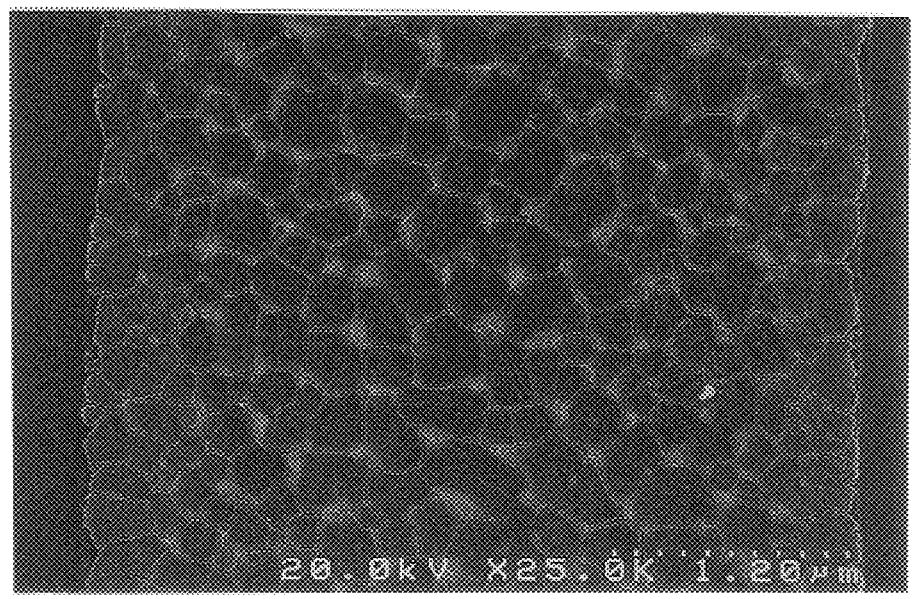
FIGS. 8A and 8B are SEM photographs showing a state of polysilicon film grains.
Figure 8B:
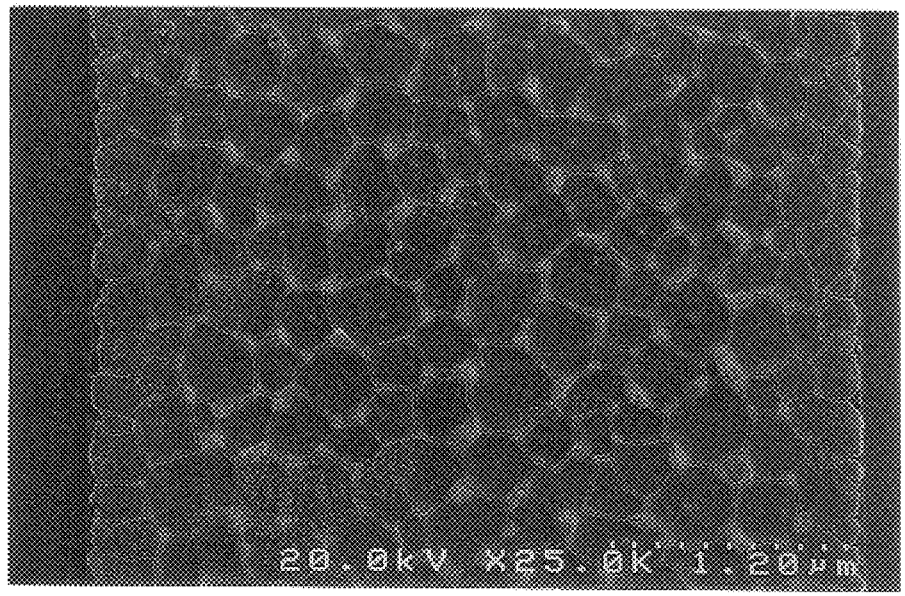
Figure 9:
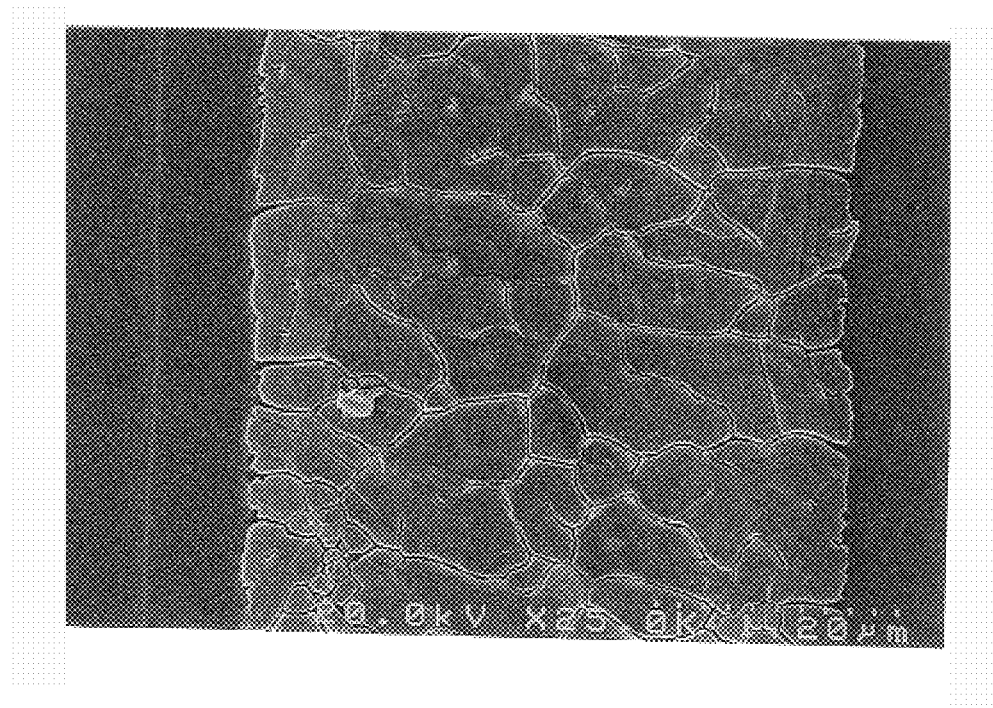
FIG. 9 is an SEM photograph showing a state of polysilicon film grains.

In embodiment 12, an experiment in which the substrate material (all having a 1.1 mm thickness) or the reflecting body material (strictly, the reflecting surface of the reflecting body) in the structure shown in FIG. 6 are variously changed, is explained. First, the substrates and the reflecting bodies in test pieces A and B used in the experiment, and their effective energy strength ratio at that time, are shown in Table 1.

TABLE 1

| Test piece | Substrate | Reflecting body | Ratio of effective energy strength |
|---|---|---|---|
| (A) | Quartz | Al | 1.00 |
| (B) | Quartz | Si | 0.67 |
| (C) | Quartz | W | 0.53 |
| (D) | Quartz | TiN | 0.33 |
| (E) | #1737 | Al | 0.29 |
| (F) | #1737 | W | 0.16 |
| (G) | #1737 | Ta | 0.11 |
| (H) | AN100 | Al | 0.07 |

Note that in Table 1, reference numeral #1737 denotes the brand name of a glass substrate manufactured by Corning Corp, and reference numeral AN100 denotes the brand name of a glass substrate manufactured by Asahi Glass Corp.

Laser light from an XeCl excimer laser was irradiated on the test pieces, manufactured having effective energy strength ratios in the range of 0.07 to 1.0, under the conditions of embodiments 1 to 3, and SEM photographs of the polysilicon films obtained as a result were examined.

It was confirmed that the average grain size was on the order of 1 μm when the effective energy strength ratio was 0.29, 0.33, 0.53, and 0.67, but when the effective energy strength ratio was 1.0, 0.16, 0.11, and 0.07, the average grain size was found to be on the order of 0.3 μm. In other words, it is thought that the average grain size becomes remarkably enlarged under conditions when the effective energy strengths of the primary laser light and the secondary laser light differ by 20% or greater. It can be thought that the above results therefore suggest that when the effective energy strength ratio $(I_0'/I_0)=0.2$ to 0.9 (preferably 0.3 to 0.7), optimal crystallization conditions will exist.

Embodiment 13

In embodiment 13, an example of finding the effective energy strength ratio by considering the influence of multiple reflection in the reflecting surface of the reflecting body in embodiment 12 is shown. Note that test pieces A to H used in the experiments are identical to those of embodiment 12. Further, the effective energy strength $I_0'$ of the secondary laser light is expressed as $I_0'=I_a T_{sub} R_{mirror} T_{sub}(1-R_{SiON-Si})/(1-R_{SiON-Si} T_{sub} R_{mirror} T_{sub})$.

Note that $T_{sub}$ is the transmittivity of the substrate, $R_{mirror}$ is the reflectivity of the surface of the reflective body, and $R_{SiON-Si}$ is the reflectivity when light is incident to the amorphous silicon film from within the SiON film. Note also that it has been shown experimentally that the reflectivity when light is incident to the SiON film from the atmosphere, the transmittivity within the SiON film, the reflectivity when light is incident to the substrate from within the SiON film, and the reflectivity when light is incident to the SiON film from within the substrate can be ignored, and therefore they were not included in the calculations.

Data calculated from the above equations is shown in Table 2. The data shown in Table 2 corresponds to the data shown in Table 1 corrected for the influence of multiple reflections.

TABLE 2

| Test piece | Substrate | Reflecting body | Ratio of effective energy strength |
|---|---|---|---|
| (A) | Quartz | Al | 1.66 |
| (B) | Quartz | Si | 0.81 |
| (C) | Quartz | W | 0.61 |
| (D) | Quartz | TiN | 0.33 |
| (E) | #1737 | Al | 0.32 |
| (F) | #1737 | W | 0.17 |
| (G) | #1737 | Ta | 0.14 |
| (H) | AN100 | Al | 0.06 |

Even when based on the data shown in Table 2, the optimal crystallization conditions stated in embodiment 7 do not change, namely that the effective energy strength ratio satisfy the conditions that $(I_0'/I_0)=0.2$ to $0.9$ (preferable $0.3$ to $0.7$).

Embodiment 14

Figure 29A:
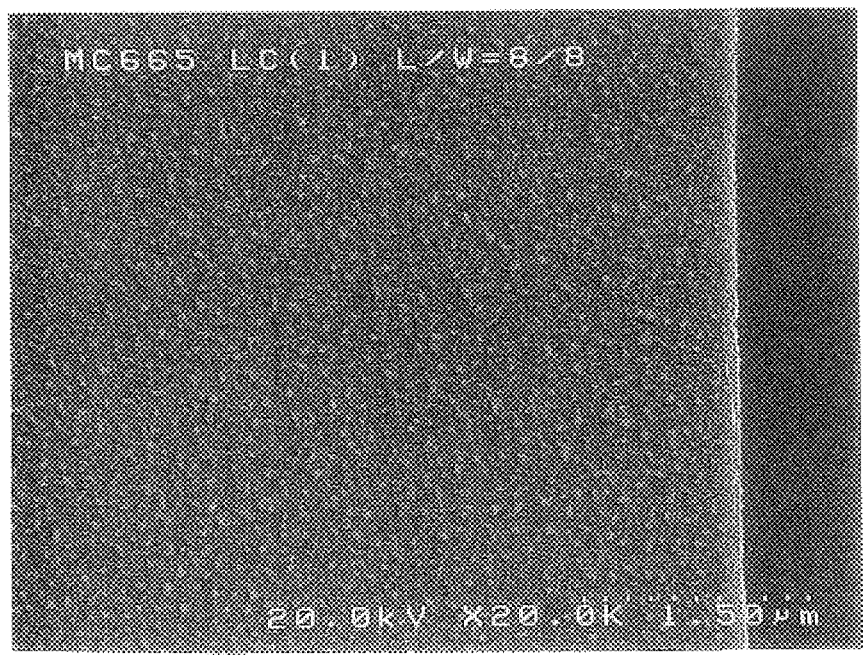
FIGS. 29A and 29B are SEM photographs showing a crystalline state of a polysilicon film.
Figure 29B:
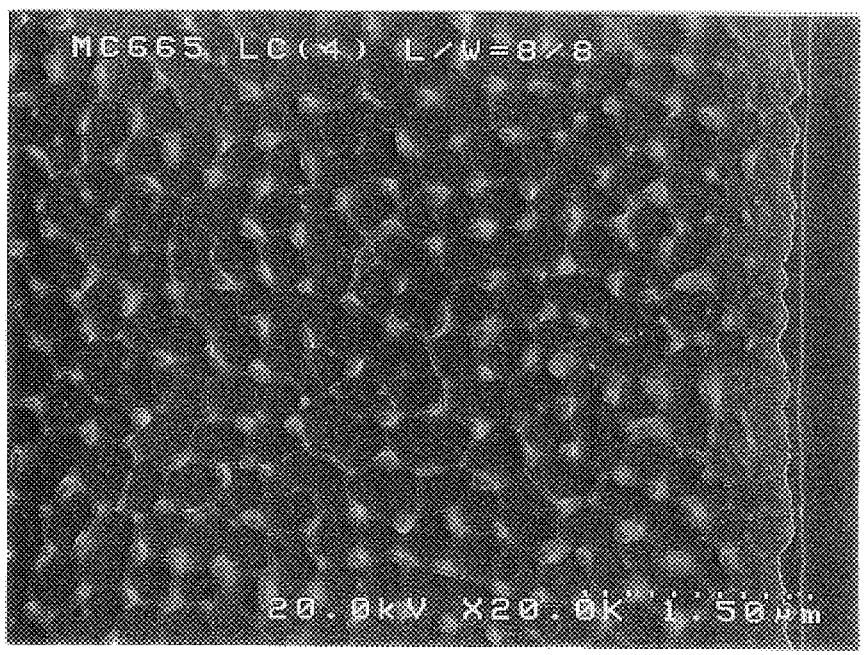
Figure 30A:
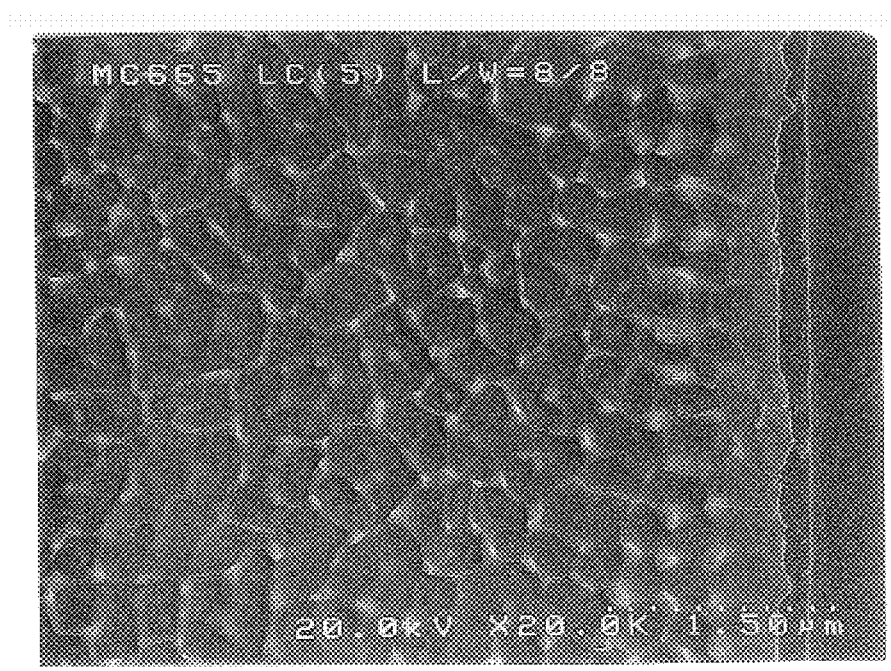
FIGS. 30A and 30B are SEM photographs showing a crystalline state of a polysilicon film.
Figure 30B:
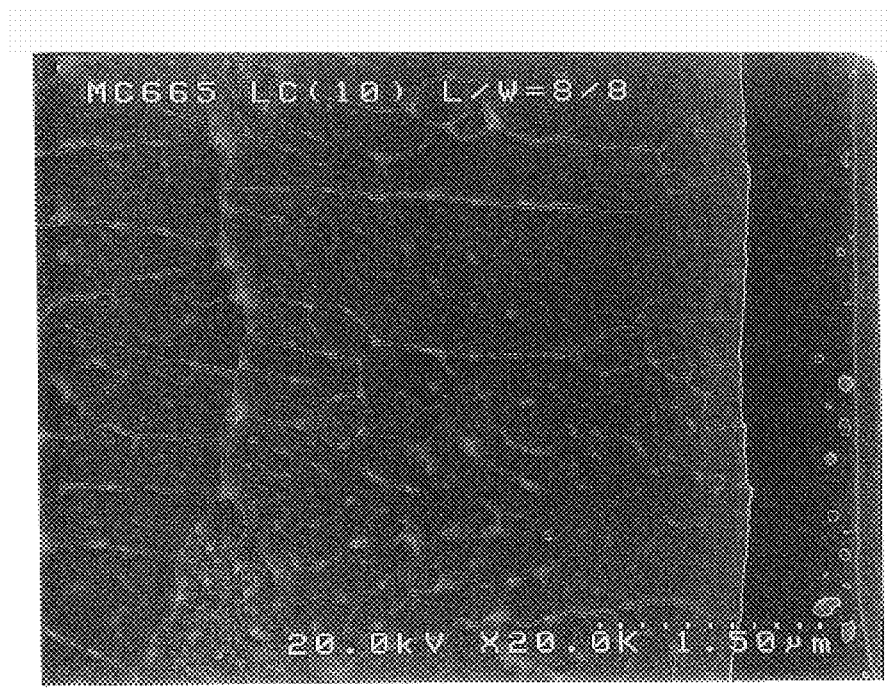

An explanation of the effect of the present invention based upon the experimental results is made in embodiment 14. Note that the crystallinity is divided into five stages and evaluated relatively. The crystal state throughout this specification is differentiated and evaluated as stated below:

Crystal state (0): a state in which the film vanishes due to ablation;

Crystal state (1): a state of microcrystallization in which fine grains are seen, as shown in FIG. 29A;

Crystal state (2): a crystalline state in which grains having an average grain size of 300 to 450 nm are seen, as shown in FIG. 29B;

Crystal state (3): a crystalline state in which grains having an average grain size of 600 to 800 nm are seen, as shown in FIG. 30A; and Crystal state (4): a crystalline state in which extremely large grains in which the major axis exceeds on the order of 3 μm as shown in FIG. 30B. Note that grains in this crystal state are referred to as grains formed due to SLG (super lateral growth) in embodiment 14.

Figure 31:
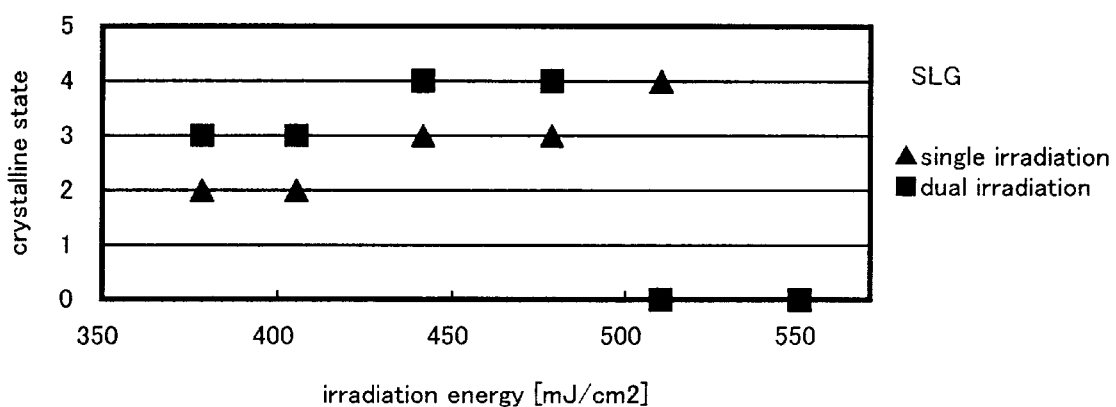
FIG. 31 is a diagram showing the relationship between irradiation energy and crystalline state.

The relationship between the laser crystallization conditions and the crystal state was investigated based on the above evaluations. The data shown in FIG. 31 is the result of comparing the relationship between irradiation energy (the energy strength $I_a$ of the laser light just before it arrives to the amorphous silicon film) and the crystal state by both single irradiation and dual irradiation. Note that single irradiation refers to a case of irradiating laser light on only the top surface, and that dual irradiation indicates a case of irradiating laser light on both the top surface and the bottom surface.

As is clear from FIG. 31, a film having a good crystalline state can be obtained at a low irradiation energy with dual irradiation. In other words, approximately 510 mJ/cm² is required in order to cause SLG in the case of single irradiation, but approximately 440 to 460 mJ/cm² is sufficient in the case of dual irradiation. This shows that, compared to conventional single irradiation, a semiconductor film having good crystallinity can be obtained a low irradiation energy by the dual irradiation method used by the present invention.

Further, it has been determined experimentally that the higher the irradiation energy, the higher the effective energy of the primary laser light becomes, and the more that the roughness of the surface of the crystalline semiconductor film formed increases. This is because of crystals obtained by SLG, and suggests that the damage imparted to the film surface can be reduced by dual irradiation.

Figure 32A:
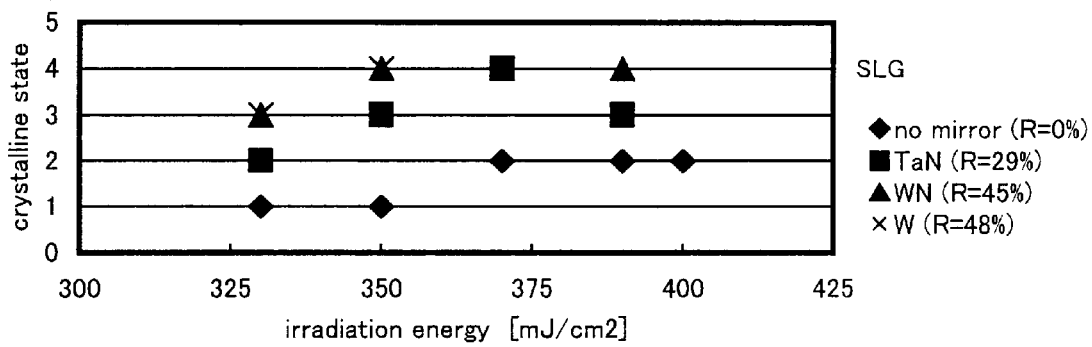
FIGS. 32A and 32B are diagrams showing the relationship between irradiation energy or effective incident energy and crystalline state.

Next, experimental results when changing the reflectivity of the reflective body and changing the effective energy strength ratio for the case of dual irradiation are shown. FIG. 32A shows the relationship between the irradiation energy and the crystal state, and FIG. 32B shows the relationship between the effective incident energy and the crystal state.

As shown in FIG. 32A, the higher the reflectivity of the reflecting body becomes (the stronger the effective energy strength of the secondary laser light becomes), the better the crystalline state that can be obtained at the same irradiation energy. This is considered to be because of cases of the same irradiation energy, the effective incident energy of dual irradiation is high. Note that the effective incident energy refers to the total effective energy incident on the amorphous semiconductor film, and corresponds to the sum of the effective energy strength of the primary laser light and the effective energy strength of the secondary laser light.

Then, with the same fixed irradiation energy, the relationship between the effective incident energy and the crystalline state was investigated. As shown in FIG. 32B, the higher the reflectivity, the higher that the effective incident energy required in order to obtain crystals formed by SLG (crystal state 4) shifts to a higher energy. In other words, when the reflectivity of the reflecting body is low, grains formed by SLG at a very low effective incident energy can easily be obtained, which means that crystallization is possible with little energy loss.

Figure 32B:
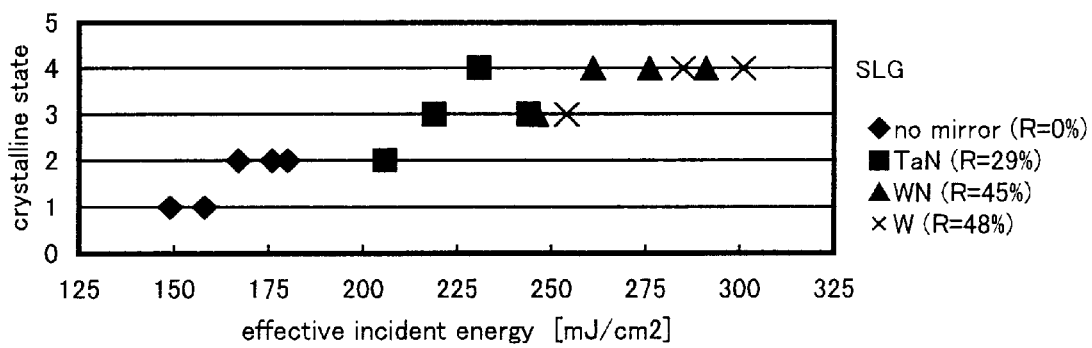

Further, as shown in FIG. 32B, if the reflectivity of the reflecting body is made low, the effective incident energy required for SLG also becomes low, but at a reflectivity of zero, it is confirmed that SLG does not develop. Thus it can be thought that optimal values for the reflectivity of the reflective body exist for SLG generation.

As shown in the present invention, when performing laser crystallization of an amorphous semiconductor film, by irradiating laser light onto both the top surface and the bottom surface of the amorphous semiconductor film at the same time, and by setting the effective energy strength of the light irradiated to the bottom surface and the effective energy strength of the light irradiated to the top surface differently, it is possible to obtain a crystalline semiconductor film having a large average grain size compared to conventional techniques.

By obtaining a large grain size crystalline semiconductor film, the performance of a TFT or a semiconductor device, typically an active matrix display device, formed by TFTs can then be greatly increased.

What is claimed is:

1. A method of manufacturing a semiconductor device comprising the steps of:

forming a semiconductor film over a substrate;

crystallizing said semiconductor film by irradiating a laser light on a top surface and a bottom surface of said semiconductor film; and forming a thin film transistor having said crystallized semiconductor film as an active layer, wherein an effective energy strength of the laser light irradiated on the top surface of the semiconductor film ($I_0$) differs from an effective energy strength of the laser light irradiated on the bottom surface of the semiconductor film ($I_0'$) during irradiation of the top surface and the bottom surface of the semiconductor film.

2. A method of manufacturing a semiconductor device comprising the steps of:

forming a semiconductor film over a substrate;

crystallizing said semiconductor film by irradiating a laser light on a top surface and a bottom surface of said semiconductor film; and forming a thin film transistor having said crystallized semiconductor film as an active layer, wherein a relationship of $0<(I_0'/I_0)<1$, or a relationship of $1<(I_0'/I_0)$ exists between an effective energy strength of the laser light irradiated on the top surface of the semiconductor film ($I_0$) and an effective energy strength of the laser light irradiated on the bottom surface of the semiconductor film ($I_0'$) during irradiation of the top surface and the bottom surface of the semiconductor film.

3. A method of manufacturing a semiconductor device comprising the steps of:

forming a semiconductor film over a substrate;

crystallizing said semiconductor film by irradiating a laser light on a top surface and a bottom surface of said semiconductor film; and forming a thin film transistor having said crystallized semiconductor film as an active layer, wherein said laser light irradiated on the bottom surface of the semiconductor film is reflected by a reflecting body formed on the bottom surface side of the semiconductor film and then irradiated on the bottom surface of the semiconductor film.

4. A method of manufacturing a semiconductor device comprising the steps of:

forming a semiconductor film over a substrate;

crystallizing said semiconductor film by irradiating a laser light on a top surface and a bottom surface of said semiconductor film; and forming a thin film transistor having said crystallized semiconductor film as an active layer, wherein said laser light irradiated on the bottom surface. of the semiconductor film is reflected by a reflecting body formed on the bottom surface side of the semiconductor film and then irradiated on the bottom surface of the semiconductor film, and wherein an effective energy strength of the laser light irradiated on the top surface of the semiconductor film ($I_0$) differs from an effective energy strength of the laser light irradiated on the bottom surface of the semiconductor film ($I_0'$).

5. A method of manufacturing a semiconductor device comprising the steps of:

forming a semiconductor film over a substrate;

crystallizing said semiconductor film by irradiating a laser light on a top surface and a bottom surface of said semiconductor film; and forming a thin film transistor having said crystallized semiconductor film as an active layer, wherein said laser light irradiated on the bottom surface of the semiconductor film is reflected by a reflecting body formed on the bottom surface side of the semiconductor film and then irradiated on the bottom surface of the semiconductor film, and wherein a relationship of $0<(I_0'/I_0)<1$, or a relationship of $1<(I_0'/I_0)$ exists between an effective energy strength of the laser light irradiated on the top surface of the semiconductor film ($I_0$) and an effective energy strength of the laser light irradiated on the bottom surface of the semiconductor film ($I_0'$).

6. A method of manufacturing a semiconductor device comprising the steps of:

forming a semiconductor film over a substrate;

crystallizing said semiconductor film by irradiating a laser light on a top surface and a bottom surface of said semiconductor film; and forming a thin film transistor having said crystallized semiconductor film as an active layer, wherein said laser light is separated by an optical system into said laser light irradiated on the top surface of the semiconductor film, and into said laser light irradiated on the bottom surface of the semiconductor film.

7. A method of manufacturing a semiconductor device comprising the steps of:

forming a semiconductor film over a substrate;

crystallizing said semiconductor film by irradiating a laser light on a top surface and bottom surface of said semiconductor film; and forming a thin film transistor having said crystallized semiconductor film as an active layer, wherein said laser light is separated by an optical system into said laser light irradiated on the top surface of the semiconductor film, and into said laser light irradiated on the bottom surface of the semiconductor film, and wherein an effective energy strength of the laser light irradiated on the top surface of the semiconductor film ($I_0$) differs from an effective energy strength of the laser light irradiated on the bottom surface of the semiconductor film ($I_0'$).

8. A method of manufacturing a semiconductor device comprising the steps of:

forming a semiconductor film over a substrate;

crystallizing said semiconductor film by irradiating a laser light on a top surface and a bottom surface of said semiconductor film; and forming a thin film transistor having said crystallized semiconductor film as an active layer, wherein said laser light is separated by an optical system into said laser light irradiated on the top surface of the semiconductor film, and into said laser light irradiated on the bottom surface of the semiconductor film, and wherein a relationship of $0<(I_0'/I_0)<1$, or a relationship of $1<(I_0'/I_0)$ exists between an effective energy strength of the laser light irradiated on the top surface of the semiconductor film ($I_0$) and an effective energy strength of the laser light irradiated on the bottom surface of the semiconductor film ($I_0'$).

9. The method according to any one of claims 1 to 8, further comprising a step of transforming said laser light into a linear shape.

10. The method according to any one of claims 1 to 8, wherein said semiconductor film is an amorphous semiconductor film or a microcrystalline semiconductor film comprising silicon.

11. The method according to any one of claims 1 to 8, wherein said semiconductor device is an EL display device.

12. The method according to any one of claims 1 to 8, wherein said semiconductor device is at least one selected from the group consisting of a personal computer, a digital camera, a video camera, a goggle type display, a player using a recording medium, an electronic amusement equipment, and a projector.

* * * * *